US012125830B2

(12) United States Patent
Choi et al.

(10) Patent No.: US 12,125,830 B2
(45) Date of Patent: Oct. 22, 2024

(54) DISPLAY DEVICE USING MICRO LED, AND MANUFACTURING METHOD THEREFOR

(71) Applicant: LG ELECTRONICS INC., Seoul (KR)

(72) Inventors: Wonseok Choi, Seoul (KR); Soohyun Kim, Seoul (KR); Sungmin Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 488 days.

(21) Appl. No.: 17/619,549

(22) PCT Filed: Jul. 1, 2019

(86) PCT No.: PCT/KR2019/007973
§ 371 (c)(1),
(2) Date: Dec. 15, 2021

(87) PCT Pub. No.: WO2021/002490
PCT Pub. Date: Jan. 7, 2021

(65) Prior Publication Data
US 2022/0415859 A1   Dec. 29, 2022

(30) Foreign Application Priority Data
Jul. 1, 2019  (KR) ........................ 10-2019-0078747

(51) Int. Cl.
*H01L 25/075*   (2006.01)
*H01L 21/683*   (2006.01)
*H01L 33/62*    (2010.01)

(52) U.S. Cl.
CPC ...... *H01L 25/0753* (2013.01); *H01L 21/6835* (2013.01); *H01L 33/62* (2013.01);
(Continued)

(58) Field of Classification Search
CPC . H01L 25/0753; H01L 21/6835; H01L 33/62; H01L 2221/68354; H01L 33/36;
(Continued)

(56) References Cited

U.S. PATENT DOCUMENTS 6,536,106 B1    3/2003  Jackson et al.
2002/0033927 A1*  3/2002  Mun ................... G02F 1/13394
                                                    349/156
(Continued)

FOREIGN PATENT DOCUMENTS

KR    1020130033450    4/2013
KR    1020150005628    1/2015
(Continued)

OTHER PUBLICATIONS

Wasisto et al. ("Beyond solid-state lighting: Miniaturization, hybrid integration, and applications of GaN nano- and micro-LEDs," Applied Physics Reviews, 6, 041315, 2019) (Year: 2019).*
(Continued)

*Primary Examiner* — Yasser A Abdelaziez
(74) *Attorney, Agent, or Firm* — LEE, HONG, DEGERMAN, KANG & WAIMEY

(57) ABSTRACT

Disclosed in the present specification are a micro LED display device in which an assembly electrode capable of forming a non-uniform electric field is assembled in a provided assembly hole, and a manufacturing method therefor. The display device according to one embodiment of the present invention comprises: a substrate; a first assembly electrode and a second assembly electrode arranged to be spaced apart on the substrate; an insulating layer deposited on top of the first assembly electrode and the second assembly electrode; an assembly hole defining a pixel area formed on the insulating layer; a semiconductor light-emitting element assembled in the assembly hole; and a
(Continued)

wiring electrode electrically connected to the semiconductor light-emitting element, wherein the first assembly electrode and the second assembly electrode have a pattern for generating non-uniform electric field in the assembly hole by means of applied voltage, and the semiconductor light-emitting element is assembled, on the basis of the non-uniform electric field, at a specific location in the assembly hole after moving in a specific direction.

20 Claims, 24 Drawing Sheets

(52) U.S. Cl.
CPC .............. *H01L 2221/68354* (2013.01); *H01L 2221/68363* (2013.01); *H01L 2933/0066* (2013.01)

(58) Field of Classification Search
CPC ......... H01L 2933/0066; H01L 33/0095; H01L 33/20; H01L 27/156; H01L 27/124; H01L 27/1259; H01L 33/005; H01L 2221/68363
See application file for complete search history.

(56) References Cited

U.S. PATENT DOCUMENTS

| | | | |
|---|---|---|---|
| 2012/0091460 A1* | 4/2012 | Park | H01L 27/1225 438/34 |
| 2015/0372013 A1* | 12/2015 | Wang | H01L 27/124 438/666 |
| 2018/0045677 A1* | 2/2018 | Walker | G01N 27/44704 |

FOREIGN PATENT DOCUMENTS

| | | |
|---|---|---|
| KR | 1020170141305 | 12/2017 |
| KR | 1020180102424 | 9/2018 |

OTHER PUBLICATIONS

PCT International Application No. PCT/2019/007973, International Search Report dated Mar. 30, 2020, 14 pages.

\* cited by examiner (a)

(b)

(a)

(b)

(a)

(b)

DISPLAY DEVICE USING MICRO LED, AND MANUFACTURING METHOD THEREFOR

CROSS-REFERENCE TO RELATED APPLICATIONS

This application is the National Stage filing under 35 U.S.C. 371 of International Application No. PCT/KR2019/007973, filed on Jul. 1, 2019, which claims the benefit of earlier filing date and right of priority to Korean Application No. 10-2019-0078747, filed on Jul. 1, 2019, the contents of which are all hereby incorporated by reference herein their entirety.

TECHNICAL FIELD

The present disclosure is applicable to a display device-related technical field, and relates, for example, to a display device using a micro LED (light emitting diode) and a method for manufacturing the same.

BACKGROUND ART

Recently, in a field of a display technology, display devices having excellent characteristics such as thinness, flexibility, and the like have been developed. On the other hand, currently commercialized major displays are represented by a LCD (liquid crystal display) and an OLED (organic light emitting diode).

However, the LCD has a response time that is not fast, and is difficult to be flexibly implemented.

On the other hand, LED (light emitting diode), which is a well-known semiconductor light-emitting element that converts electric current into light, has been used as a light source for a display image of an electronic device including an information and communication device along with a GaP:N-based green LED, starting with commercialization of a red LED using a GaAsP compound semiconductor in 1962. Accordingly, a method for solving the above-described problems by implementing a display using the semiconductor light-emitting element may be proposed. Such light emitting diode has various advantages, such as long lifespan, low power consumption, excellent initial driving characteristics, high vibration resistance, and the like, compared to a filament-based light-emitting element.

A size of such semiconductor light-emitting element has recently been reduced to tens of micrometers. Therefore, when implementing the display device using the semiconductor light-emitting elements, a very large number of semiconductor light-emitting elements must be assembled on a wiring substrate of the display device.

However, during the assembly process, there is a problem in that it is very difficult to precisely position a number of semiconductor light-emitting elements at desired positions on the wiring substrate.

DISCLOSURE

Technical Problem

An object of an embodiment of the present disclosure is to provide a display device and a method for manufacturing the same using a semiconductor light-emitting element.

Another object of an embodiment of the present disclosure is to provide a display device capable of precise position control when assembling a semiconductor light-emitting element on a substrate, and a method for manufacturing the same.

Furthermore, a purpose of another embodiment of the present disclosure is to solve various problems not mentioned herein. Those skilled in the art may understand it through the full text of the specification and drawings.

Technical Solutions

A display device for achieving the above purpose includes a substrate, a first assembly electrode and a second assembly electrode disposed on the substrate to be spaced apart from each other, an insulating layer deposited on top of the first assembly electrode and the second assembly electrode, an assembly hole defining a pixel region formed on the insulating layer, a semiconductor light-emitting element assembled into the assembly hole, and a wiring electrode electrically connected to the semiconductor light-emitting element, the first assembly electrode and the second assembly electrode have a pattern to generate a non-uniform electric field in the assembly hole by an applied voltage, and the semiconductor light-emitting element is moved in a specific direction based on the non-uniform electric field and then assembled at a specific position in the assembly hole.

As an embodiment, the specific position in the assembly hole corresponds to a region where a strength of the electric field is relatively great in the non-uniform electric field generated in the assembly hole.

As an embodiment, the first assembly electrode and the second assembly electrode are respectively formed at positions overlapping the assembly hole, and a separation distance between the first assembly electrode and the second assembly electrode is smaller than a horizontal length of the semiconductor light-emitting element.

As an embodiment, the separation distance has at least two different values, and the semiconductor light-emitting element is assembled in a direction of a minimum value of the separation distance among the values of the separation distance.

As an embodiment, at least one of the first assembly electrode and the second assembly electrode is formed at a position overlapping the assembly hole.

As an embodiment, the first assembly electrode and the second assembly electrode form a symmetrical structure, and respectively have protrusions protruding toward a center of the assembly hole, and the semiconductor light-emitting element is assembled at the center of the assembly hole.

As an embodiment, a width of the assembly hole is greater than a horizontal length of the semiconductor light-emitting element, and a depth of the assembly hole is greater than a longitudinal length of the semiconductor light-emitting element.

As an embodiment, the semiconductor light-emitting element includes a first conductivity type semiconductor layer, an active layer, a second conductivity type semiconductor layer, and a magnetic layer.

As an embodiment, the substrate is equipped with a transistor for driving an active matrix.

A method for manufacturing a display device according to another embodiment of the present disclosure includes forming a pair of assembly electrodes spaced apart from each other on a first substrate, depositing an insulating layer on the substrate having the pair of assembly electrodes formed thereon, defining an assembly hole in the substrate having the insulating layer deposited thereon, providing a semiconductor light-emitting element having a shape corresponding to a shape of the assembly hole and having a magnetic layer, bringing the semiconductor light-emitting element into contact with the assembly hole of the substrate using an assembly apparatus having a magnetic body, and applying a voltage to the pair of assembly electrodes formed beneath the assembly hole to assemble the semiconductor light-emitting element at a specific position in the assembly hole, the pair of assembly electrodes have a pattern to generate a non-uniform electric field in the assembly hole by the applied voltage, and the semiconductor light-emitting element is assembled in a direction of the electric field with a great strength in the assembly hole based on the non-uniform electric field.

As an embodiment, the method further includes transferring the semiconductor light-emitting element assembled onto the first substrate to a second substrate.

As an embodiment, the transferring of the semiconductor light-emitting element to the second substrate includes forming a wiring electrode and a conductive adhesive layer on the second substrate, and attaching the first substrate to the conductive adhesive layer such that the semiconductor light-emitting element of the first substrate is aligned with the wiring electrode.

As an embodiment, the defining of the assembly hole includes defining the assembly hole at a position overlapping at least one of the pair of assembly electrodes.

As an embodiment, the assembling of the semiconductor light-emitting element includes applying an alternating voltage to one of the pair of assembly electrodes, and grounding the other.

As an embodiment, the semiconductor light-emitting element is an LED (a micro-LED) having a size on the order of micrometers.

Advantageous Effects

According to one embodiment of the present disclosure, it is possible to provide a display device and a method for manufacturing the same using a semiconductor light-emitting element.

Specifically, when a plurality of semiconductor light-emitting elements are self-assembled in a fluid, by adjusting shapes and arrangement of a first assembly electrode and a second assembly electrode to form a non-uniform electric field in an assembly hole, the semiconductor light-emitting element may be precisely assembled at a specific position of the assembly hole.

Therefore, there is a technical effect of minimizing an assembly error caused by a difference in width between the assembly hole and the semiconductor light-emitting element, and reducing short or open defects of a chip generated in subsequent planarization process and electrode formation process.

Furthermore, according to another embodiment of the present disclosure, there are additional effects not mentioned herein. Those of ordinary skill in the art may understand it through the full text of the specification and drawings.

BEST MODE

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the semiconductor light-emitting element mentioned in this specification is a concept including an LED, a micro LED, and the like.

Figure 1:
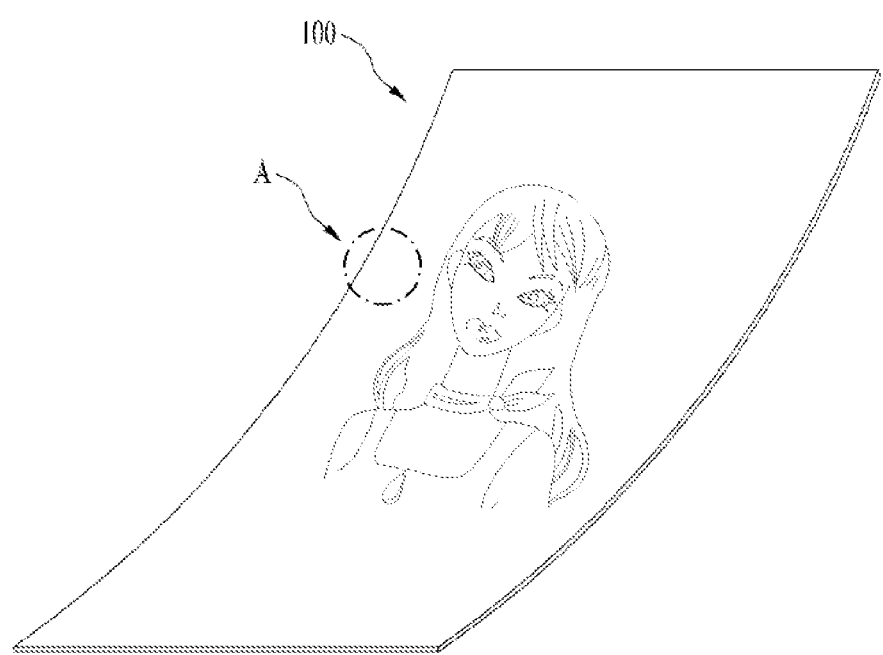
FIG. 1 is a conceptual diagram illustrating an embodiment of a display device using a semiconductor light-emitting element according to the present disclosure.

FIG. 1 is a conceptual view illustrating an embodiment of a display device using a semiconductor light-emitting element according to the present disclosure.

As shown in FIG. 1, information processed by a controller (not shown) of a display device 100 may be displayed using a flexible display.

The flexible display may include, for example, a display that can be warped, bent, twisted, folded, or rolled by external force.

Furthermore, the flexible display may be, for example, a display manufactured on a thin and flexible substrate that can be warped, bent, folded, or rolled like paper while maintaining the display characteristics of a conventional flat panel display.

When the flexible display remains in an unbent state (e.g., a state having an infinite radius of curvature) (hereinafter referred to as a first state), the display area of the flexible display forms a flat surface. When the display in the first state is changed to a bent state (e.g., a state having a finite radius of curvature) (hereinafter referred to as a second state) by external force, the display area may be a curved surface. As shown in FIG. 1, the information displayed in the second state may be visual information output on a curved surface. Such visual information may be implemented by independently controlling the light emission of sub-pixels arranged in a matrix form. The unit pixel may mean, for example, a minimum unit for implementing one color.

The unit pixel of the flexible display may be implemented by a semiconductor light-emitting element. In the present disclosure, a light emitting diode (LED) is exemplified as a type of the semiconductor light-emitting element configured to convert electric current into light. The LED may be formed in a small size, and may thus serve as a unit pixel even in the second state.

Hereinafter, a flexible display implemented using the LED will be described in more detail with reference to the drawings.

Figure 2:
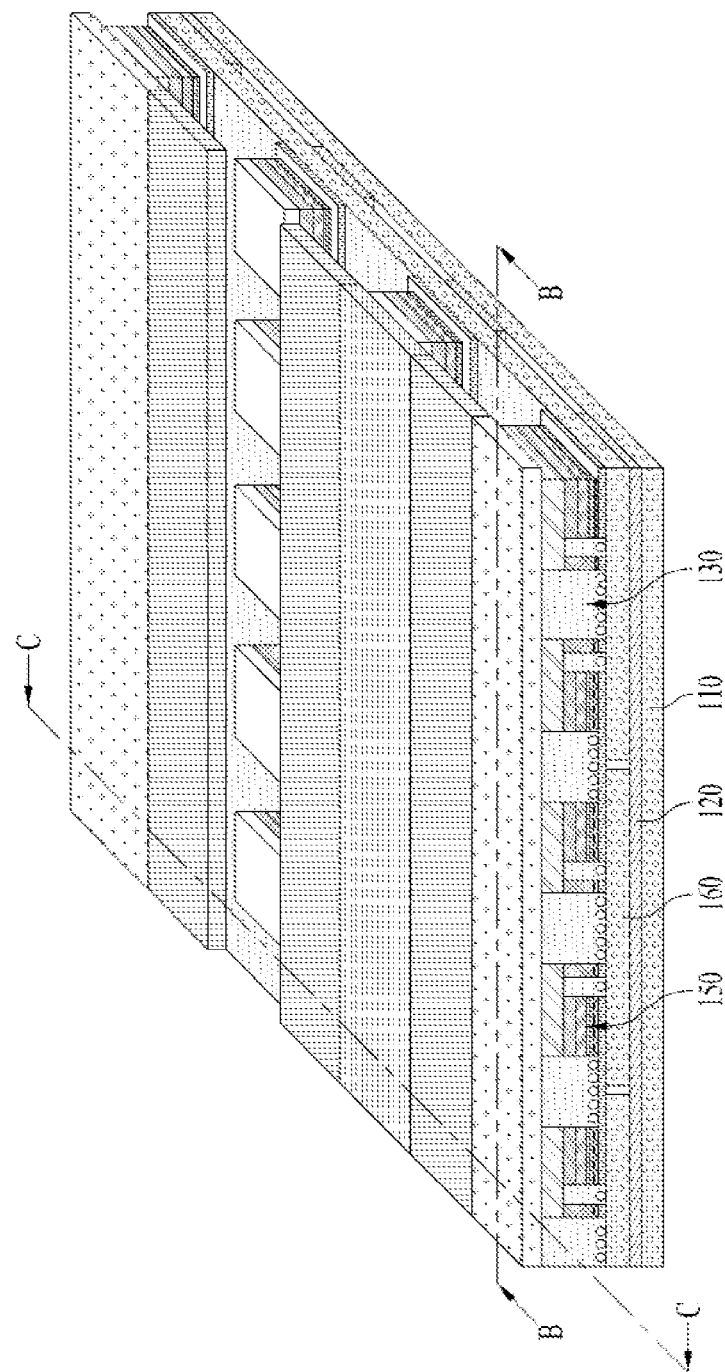
FIG. 2 is a partially enlarged diagram showing a part A shown in FIG. 1.

FIG. 2 is a partially enlarged view showing part A of FIG. 1.

Figure 3A:
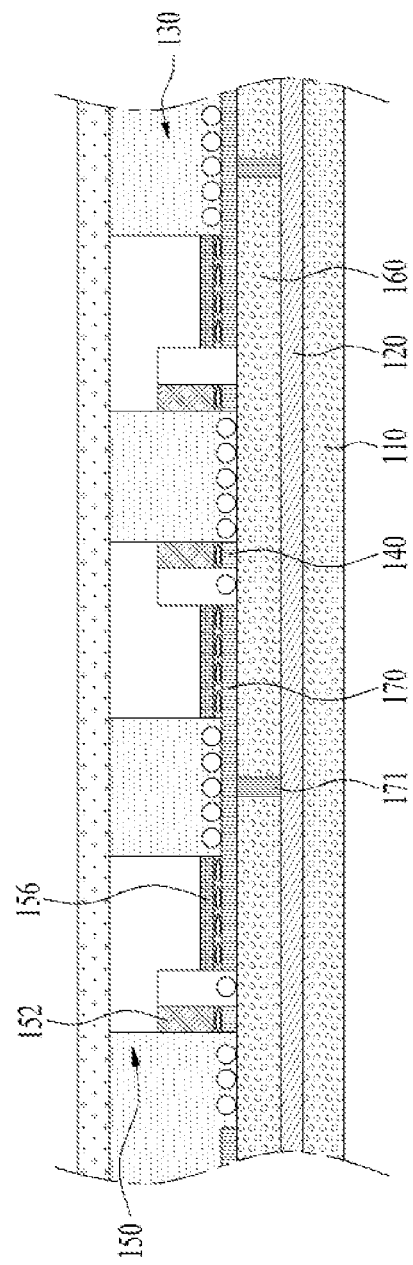
FIGS. 3A and 3B are cross-sectional diagrams taken along the cutting lines B-B and C-C in FIG. 2.
Figure 3B:
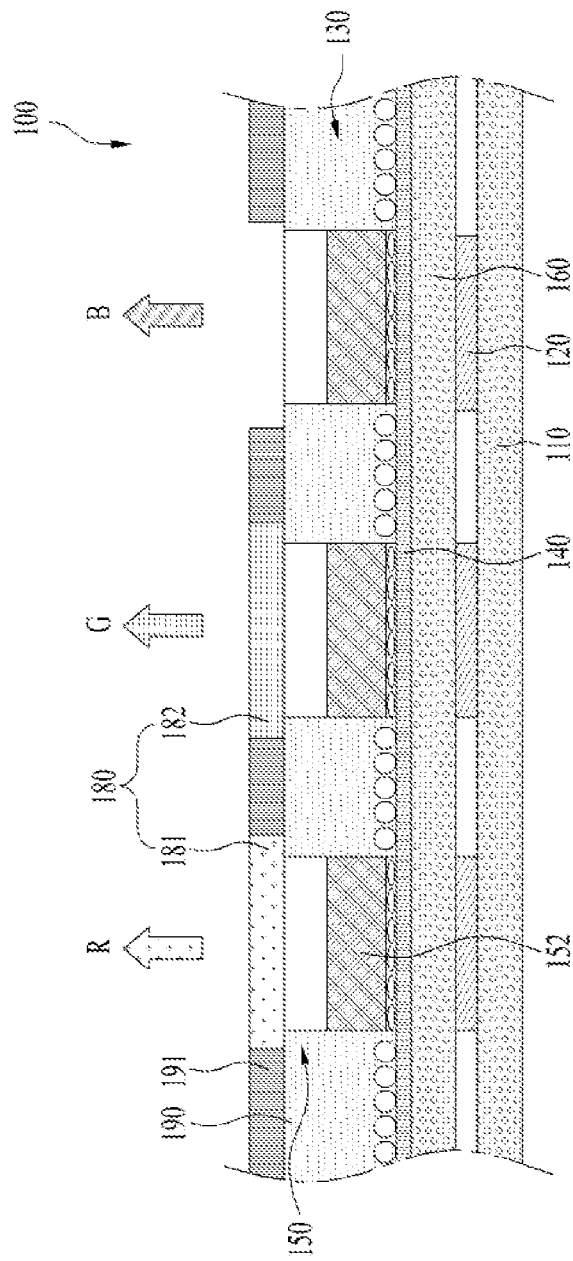

FIGS. 3A and 3B are cross-sectional views taken along lines B-B and C-C in FIG. 2.

Figure 4:
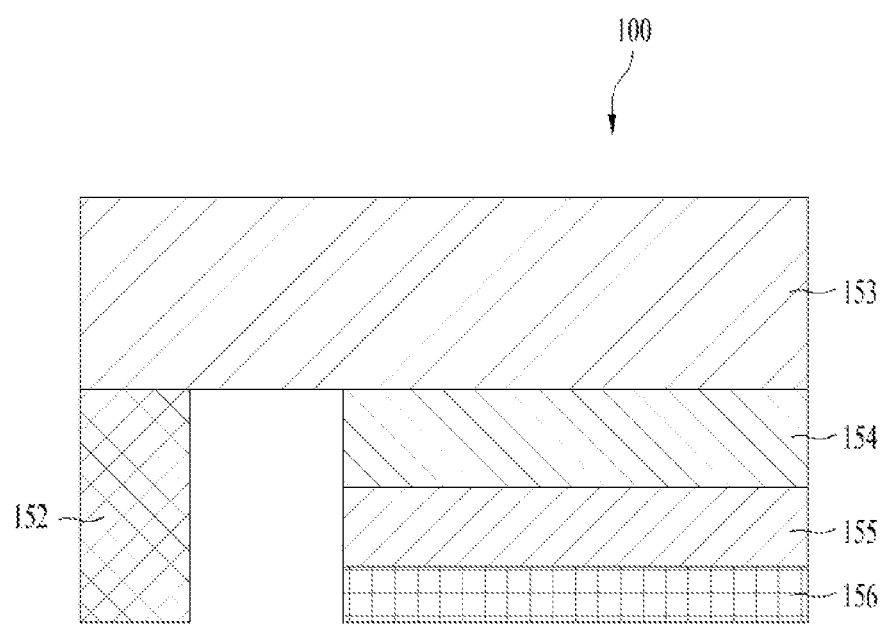
FIG. 4 is a conceptual diagram illustrating the flip-chip type semiconductor light-emitting element of FIG. 3.

FIG. 4 is a conceptual view illustrating the flip-chip type semiconductor light-emitting element of FIG. 3.

Figure 5A:
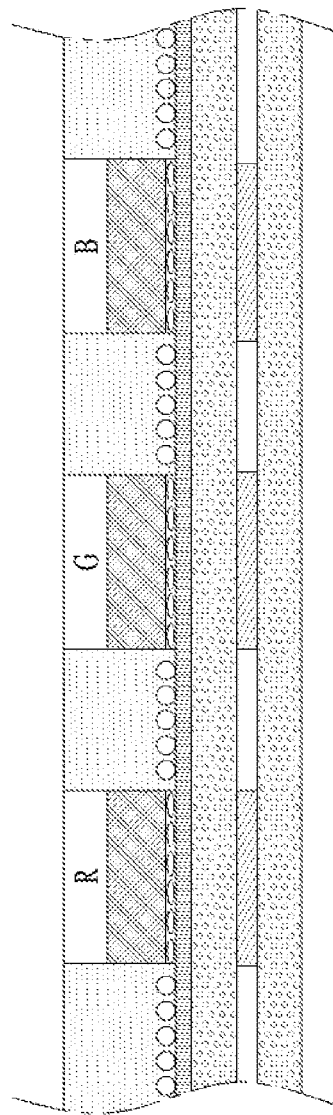
FIGS. 5A to 5C are conceptual diagrams illustrating various examples of color implementation with respect to a flip-chip type semiconductor light-emitting element.
Figure 5B:
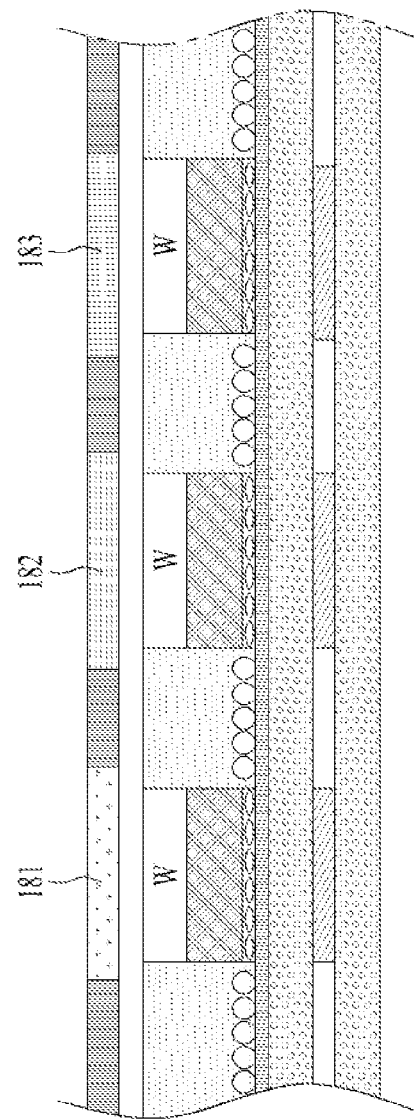
Figure 5C:
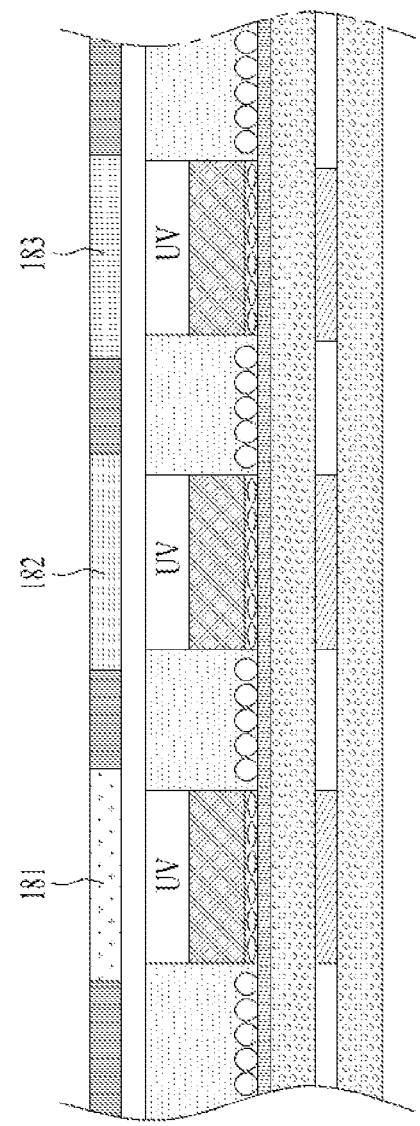

FIGS. 5A to 5C are conceptual views illustrating various examples of implementation of colors in relation to a flip-chip type semiconductor light-emitting element.

As shown in FIGS. 2, 3A and 3B, the display device 100 using a passive matrix (PM) type semiconductor light-emitting element is exemplified as the display device 100 using a semiconductor light-emitting element. However, the examples described below are also applicable to an active matrix (AM) type semiconductor light-emitting element.

The display device 100 shown in FIG. 1 may include a substrate 110, a first electrode 120, a conductive adhesive layer 130, a second electrode 140, and at least one semiconductor light-emitting element 150, as shown in FIG. 2.

The substrate 110 may be a flexible substrate. For example, to implement a flexible display device, the substrate 110 may include glass or polyimide (PI). Any insulative and flexible material such as polyethylene naphthalate (PEN) or polyethylene terephthalate (PET) may be employed. In addition, the substrate 110 may be formed of either a transparent material or an opaque material.

The substrate 110 may be a wiring substrate on which the first electrode 120 is disposed. Thus, the first electrode 120 may be positioned on the substrate 110.

As shown in FIG. 3A, an insulating layer 160 may be disposed on the substrate 110 on which the first electrode 120 is positioned, and an auxiliary electrode 170 may be positioned on the insulating layer 160. In this case, a stack in which the insulating layer 160 is laminated on the substrate 110 may be a single wiring substrate. More specifically, the insulating layer 160 may be formed of an insulative and flexible material such as PI, PET, or PEN, and may be integrated with the substrate 110 to form a single substrate.

The auxiliary electrode 170, which is an electrode that electrically connects the first electrode 120 and the semiconductor light-emitting element 150, is positioned on the insulating layer 160, and is disposed to correspond to the position of the first electrode 120. For example, the auxiliary electrode 170 may have a dot shape and may be electrically connected to the first electrode 120 by an electrode hole 171 formed through the insulating layer 160. The electrode hole 171 may be formed by filling a via hole with a conductive material.

As shown in FIG. 2 or 3A, a conductive adhesive layer 130 may be formed on one surface of the insulating layer 160, but embodiments of the present disclosure are not limited thereto. For example, a layer performing a specific function may be formed between the insulating layer 160 and the conductive adhesive layer 130, or the conductive adhesive layer 130 may be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity. For this purpose, a material having conductivity and a material having adhesiveness may be mixed in the conductive adhesive layer 130. In addition, the conductive adhesive layer 130 may have ductility, thereby providing making the display device flexible.

As an example, the conductive adhesive layer 130 may be an anisotropic conductive film (ACF), an anisotropic conductive paste, a solution containing conductive particles, or the like. The conductive adhesive layer 130 may be configured as a layer that allows electrical interconnection in the direction of the Z-axis extending through the thickness, but is electrically insulative in the horizontal X-Y direction. Accordingly, the conductive adhesive layer 130 may be referred to as a Z-axis conductive layer (hereinafter, referred to simply as a "conductive adhesive layer").

The ACF is a film in which an anisotropic conductive medium is mixed with an insulating base member. When the ACF is subjected to heat and pressure, only a specific portion thereof becomes conductive by the anisotropic conductive medium. Hereinafter, it will be described that heat and pressure are applied to the ACF. However, another method may be used to make the ACF partially conductive. The other method may be, for example, application of only one of the heat and pressure or UV curing.

In addition, the anisotropic conductive medium may be, for example, conductive balls or conductive particles. For example, the ACF may be a film in which conductive balls are mixed with an insulating base member. Thus, when heat and pressure are applied to the ACF, only a specific portion of the ACF is allowed to be conductive by the conductive balls. The ACF may contain a plurality of particles formed by coating the core of a conductive material with an insulating film made of a polymer material. In this case, as the insulating film is destroyed in a portion to which heat and pressure are applied, the portion is made to be conductive by the core. At this time, the cores may be deformed to form layers that contact each other in the thickness direction of the film. As a more specific example, heat and pressure are applied to the whole ACF, and an electrical connection in the Z-axis direction is partially formed by the height difference of a counterpart adhered by the ACF.

As another example, the ACF may contain a plurality of particles formed by coating an insulating core with a conductive material. In this case, as the conductive material is deformed (pressed) in a portion to which heat and pressure are applied, the portion is made to be conductive in the thickness direction of the film. As another example, the conductive material may be disposed through the insulating base member in the Z-axis direction to provide conductivity in the thickness direction of the film. In this case, the conductive material may have a pointed end.

The ACF may be a fixed array ACF in which conductive balls are inserted into one surface of the insulating base member. More specifically, the insulating base member may be formed of an adhesive material, and the conductive balls may be intensively disposed on the bottom portion of the insulating base member. Thus, when the base member is subjected to heat and pressure, it may be deformed together with the conductive balls, exhibiting conductivity in the vertical direction.

However, the present disclosure is not necessarily limited thereto, and the ACF may be formed by randomly mixing conductive balls in the insulating base member, or may be composed of a plurality of layers with conductive balls arranged on one of the layers (as a double-ACF).

The anisotropic conductive paste may be a combination of a paste and conductive balls, and may be a paste in which conductive balls are mixed with an insulating and adhesive base material. Also, the solution containing conductive particles may be a solution containing any conductive particles or nanoparticles.

Referring back to FIG. 3A, the second electrode 140 is positioned on the insulating layer 160 and spaced apart from the auxiliary electrode 170. That is, the conductive adhesive layer 130 is disposed on the insulating layer 160 having the auxiliary electrode 170 and the second electrode 140 positioned thereon.

After the conductive adhesive layer 130 is formed with the auxiliary electrode 170 and the second electrode 140 positioned on the insulating layer 160, the semiconductor light-emitting element 150 is connected thereto in a flip-chip form by applying heat and pressure. Thereby, the semiconductor light-emitting element 150 is electrically connected to the first electrode 120 and the second electrode 140.

Referring to FIG. 4, the semiconductor light-emitting element may be a flip-chip type light-emitting element.

For example, the semiconductor light-emitting element may include a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 disposed on the n-type semiconductor layer 153 and horizontally spaced apart from the p-type electrode 156. In this case, the p-type electrode 156 may be electrically connected to the auxiliary electrode 170, which is shown in FIG. 3, by the conductive adhesive layer 130, and the n-type electrode 152 may be electrically connected to the second electrode 140.

Referring back to FIGS. 2, 3A and 3B, the auxiliary electrode 170 may be elongated in one direction. Thus, one auxiliary electrode may be electrically connected to the plurality of semiconductor light-emitting elements 150. For example, p-type electrodes of semiconductor light-emitting elements on left and right sides of an auxiliary electrode may be electrically connected to one auxiliary electrode.

More specifically, the semiconductor light-emitting element 150 may be press-fitted into the conductive adhesive layer 130 by heat and pressure. Thereby, only the portions of the semiconductor light-emitting element 150 between the p-type electrode 156 and the auxiliary electrode 170 and between the n-type electrode 152 and the second electrode 140 may exhibit conductivity, and the other portions of the semiconductor light-emitting element 150 do not exhibit conductivity as they are not press-fitted. In this way, the conductive adhesive layer 130 interconnects and electrically connects the semiconductor light-emitting element 150 and the auxiliary electrode 170 and interconnects and electrically connects the semiconductor light-emitting element 150 and the second electrode 140.

The plurality of semiconductor light-emitting elements 150 may constitute a light-emitting element array, and a phosphor conversion layer 180 may be formed on the light-emitting element array.

The light-emitting element array may include a plurality of semiconductor light-emitting elements having different luminance values. Each semiconductor light-emitting element 150 may constitute a unit pixel and may be electrically connected to the first electrode 120. For example, a plurality of first electrodes 120 may be provided, and the semiconductor light-emitting elements may be arranged in, for example, several columns. The semiconductor light-emitting elements in each column may be electrically connected to any one of the plurality of first electrodes.

In addition, since the semiconductor light-emitting elements are connected in a flip-chip form, semiconductor light-emitting elements grown on a transparent dielectric substrate may be used. The semiconductor light-emitting elements may be, for example, nitride semiconductor light-emitting elements. Since the semiconductor light-emitting element 150 has excellent luminance, it may constitute an individual unit pixel even when it has a small size.

As shown in FIG. 3, a partition wall 190 may be formed between the semiconductor light-emitting elements 150. In this case, the partition wall 190 may serve to separate individual unit pixels from each other, and may be integrated with the conductive adhesive layer 130. For example, by inserting the semiconductor light-emitting element 150 into the ACF, the base member of the ACF may form the partition wall.

In addition, when the base member of the ACF is black, the partition wall 190 may have reflectance and increase contrast even without a separate black insulator.

As another example, a reflective partition wall may be separately provided as the partition wall 190. In this case, the partition wall 190 may include a black or white insulator depending on the purpose of the display device. When a partition wall including a white insulator is used, reflectivity may be increased. When a partition wall including a black insulator is used, it may have reflectance and increase contrast.

The phosphor conversion layer 180 may be positioned on the outer surface of the semiconductor light-emitting element 150. For example, the semiconductor light-emitting element 150 may be a blue semiconductor light-emitting element that emits blue (B) light, and the phosphor conversion layer 180 may function to convert the blue (B) light into a color of a unit pixel. The phosphor conversion layer 180 may be a red phosphor 181 or a green phosphor 182 constituting an individual pixel.

That is, the red phosphor 181 capable of converting blue light into red (R) light may be laminated on a blue semiconductor light-emitting element at a position of a unit pixel of red color, and the green phosphor 182 capable of converting blue light into green (G) light may be laminated on the blue semiconductor light-emitting element at a position of a unit pixel of green color. Only the blue semiconductor light-emitting element may be used alone in the portion constituting the unit pixel of blue color. In this case, unit pixels of red (R), green (G), and blue (B) may constitute one pixel. More specifically, a phosphor of one color may be laminated along each line of the first electrode 120. Accordingly, one line on the first electrode 120 may be an electrode for controlling one color. That is, red (R), green (G), and blue (B) may be sequentially disposed along the second electrode 140, thereby implementing a unit pixel.

However, embodiments of the present disclosure are not limited thereto. Unit pixels of red (R), green (G), and blue (B) may be implemented by combining the semiconductor light-emitting element 150 and the quantum dot (QD) rather than using the phosphor.

Also, a black matrix 191 may be disposed between the phosphor conversion layers to improve contrast. That is, the black matrix 191 may improve contrast of light and darkness.

However, embodiments of the present disclosure are not limited thereto, and anther structure may be applied to implement blue, red, and green colors.

Referring to FIG. 5A, each semiconductor light-emitting element may be implemented as a high-power light-emitting element emitting light of various colors including blue by using gallium nitride (GaN) as a main material and adding indium (In) and/or aluminum (Al).

In this case, each semiconductor light-emitting element may be a red, green, or blue semiconductor light-emitting element to form a unit pixel (sub-pixel). For example, red, green, and blue semiconductor light-emitting elements R, G, and B may be alternately disposed, and unit pixels of red, green, and blue may constitute one pixel by the red, green and blue semiconductor light-emitting elements. Thereby, a full-color display may be implemented.

Referring to FIG. 5B, the semiconductor light-emitting element 150a may include a white light-emitting element W having a yellow phosphor conversion layer, which is provided for each device. In this case, in order to form a unit pixel, a red phosphor conversion layer 181, a green phosphor conversion layer 182, and a blue phosphor conversion layer 183 may be disposed on the white light-emitting element W. In addition, a unit pixel may be formed using a color filter repeating red, green, and blue on the white light-emitting element W.

Referring to FIG. 5C, a red phosphor conversion layer 181, a green phosphor conversion layer 185, and a blue phosphor conversion layer 183 may be provided on a ultraviolet light-emitting element. Not only visible light but also ultraviolet (UV) light may be used in the entire region of the semiconductor light-emitting element. In an embodiment, UV may be used as an excitation source of the upper phosphor in the semiconductor light-emitting element.

Referring back to this example, the semiconductor light-emitting element is positioned on the conductive adhesive layer to constitute a unit pixel in the display device. Since the semiconductor light-emitting element has excellent luminance, individual unit pixels may be configured despite even when the semiconductor light-emitting element has a small size.

Regarding the size of such an individual semiconductor light-emitting element, the length of each side of the device may be, for example, 80 μm or less, and the device may have a rectangular or square shape. When the semiconductor light-emitting element has a rectangular shape, the size thereof may be less than or equal to 20 μm×80 μm.

In addition, even when a square semiconductor light-emitting element having a side length of 10 μm is used as a unit pixel, sufficient brightness to form a display device may be obtained.

Therefore, for example, in case of a rectangular pixel having a unit pixel size of 600 μm×300 μm (i.e., one side by the other side), a distance of a semiconductor light-emitting element becomes sufficiently long relatively.

Thus, in this case, it is able to implement a flexible display device having high image quality over HD image quality.

The above-described display device using the semiconductor light-emitting element may be prepared by a new fabricating method. Such a fabricating method will be described with reference to FIG. 6 as follows.

Figure 6:
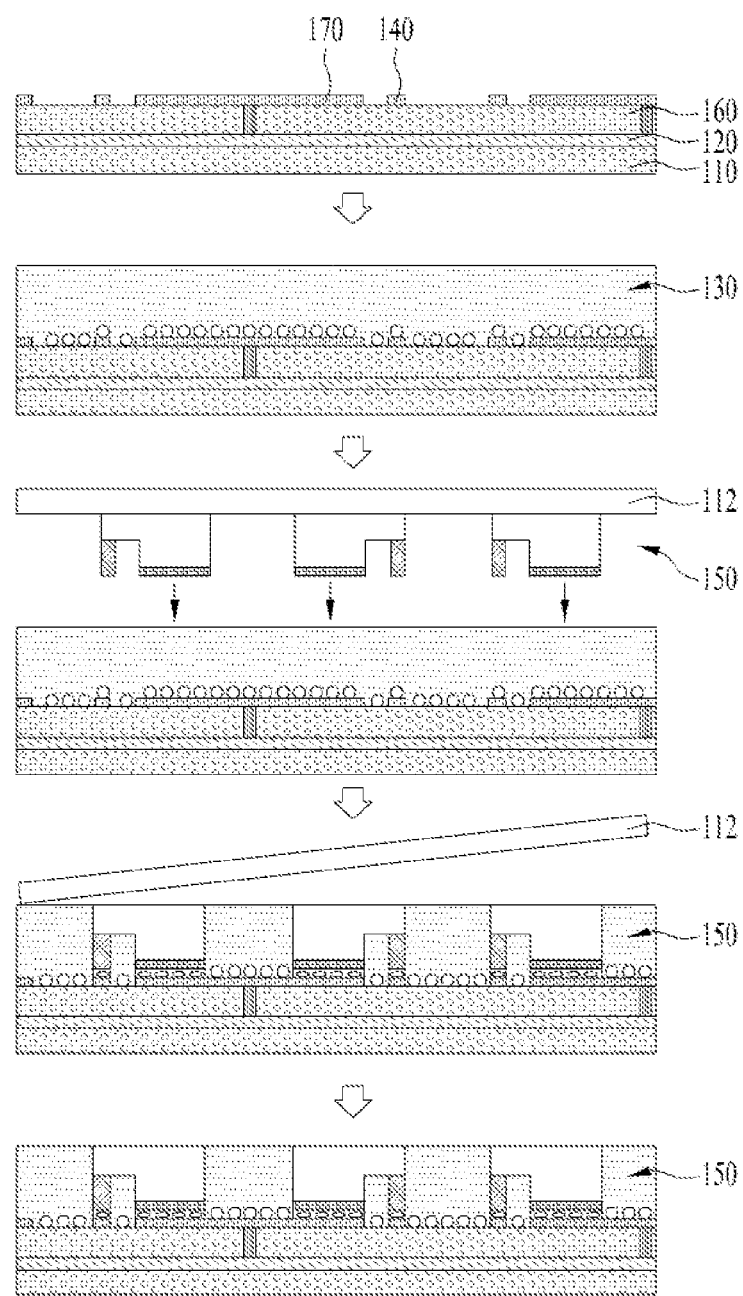
FIG. 6 shows cross-sectional views of a method of fabricating a display device using a semiconductor light-emitting element according to the present disclosure.

FIG. 6 shows cross-sectional views of a method of fabricating a display device using a semiconductor light-emitting element according to the present disclosure.

Referring to FIG. 6, first of all, a conductive adhesive layer 130 is formed on an insulating layer 160 located between an auxiliary electrode 170 and a second electrode 140. The insulating layer 160 is tacked on a wiring substrate 110. On the wiring substrate 110, a first electrode 120, the auxiliary electrode 170 and the second electrode 140 are disposed. In this case, the first electrode 120 and the second electrode 140 may be disposed in mutually orthogonal directions, respectively. In order to implement a flexible display device, the wiring substrate 110 and the insulating layer 160 may include glass or polyimide (PI) each.

For example, the conductive adhesive layer 130 may be implemented by an anisotropic conductive film. To this end, an anisotropic conductive film may be coated on the substrate on which the insulating layer 160 is located.

Subsequently, a temporary substrate 112, on which a plurality of semiconductor light-emitting elements 150 configuring individual pixels are located to correspond to locations of the auxiliary electrode 170 and the second electrodes 140, is disposed in a manner that the semiconductor light-emitting element 150 confronts the auxiliary electrode 170 and the second electrode 140.

In this regard, the temporary 112 substrate 112 is a growing substrate for growing the semiconductor light-emitting element 150 and may include a sapphire or silicon substrate.

The semiconductor light-emitting element is configured to have a space and size for configuring a display device when formed in unit of wafer, thereby being effectively used for the display device.

Subsequently, the wiring substrate 110 and the temporary substrate 112 are thermally compressed together. By the thermocompression, the wiring substrate 110 and the temporary substrate 112 are bonded together. Owing to the property of an anisotropic conductive film having conductivity by thermocompression, only a portion among the semiconductor light-emitting element 150, the auxiliary electrode 170 and the second electrode 140 has conductivity, via which the electrodes and the semiconductor light-emitting element 150 may be connected electrically. In this case, the semiconductor light-emitting element 150 is inserted into the anisotropic conductive film, by which a partition may be formed between the semiconductor light-emitting elements 150.

Then the temporary substrate 112 is removed. For example, the temporary substrate 112 may be removed using Laser Lift-Off (LLO) or Chemical Lift-Off (CLO).

Finally, by removing the temporary substrate 112, the semiconductor light-emitting elements 150 exposed externally. If necessary, the wiring substrate 110 to which the semiconductor light-emitting elements 150 are coupled may be coated with silicon oxide (SiOx) or the like to form a transparent insulating layer (not shown).

In addition, a step of forming a phosphor layer on one side of the semiconductor light-emitting element 150 may be further included. For example, the semiconductor light-emitting element 150 may include a blue semiconductor light-emitting element emitting Blue (B) light, and a red or green phosphor for converting the blue (B) light into a color of a unit pixel may form a layer on one side of the blue semiconductor light-emitting element.

The above-described fabricating method or structure of the display device using the semiconductor light-emitting element may be modified into various forms. For example, the above-described display device may employ a vertical semiconductor light-emitting element.

Furthermore, a modification or embodiment described in the following may use the same or similar reference numbers for the same or similar configurations of the former example and the former description may apply thereto.

Figure 7:
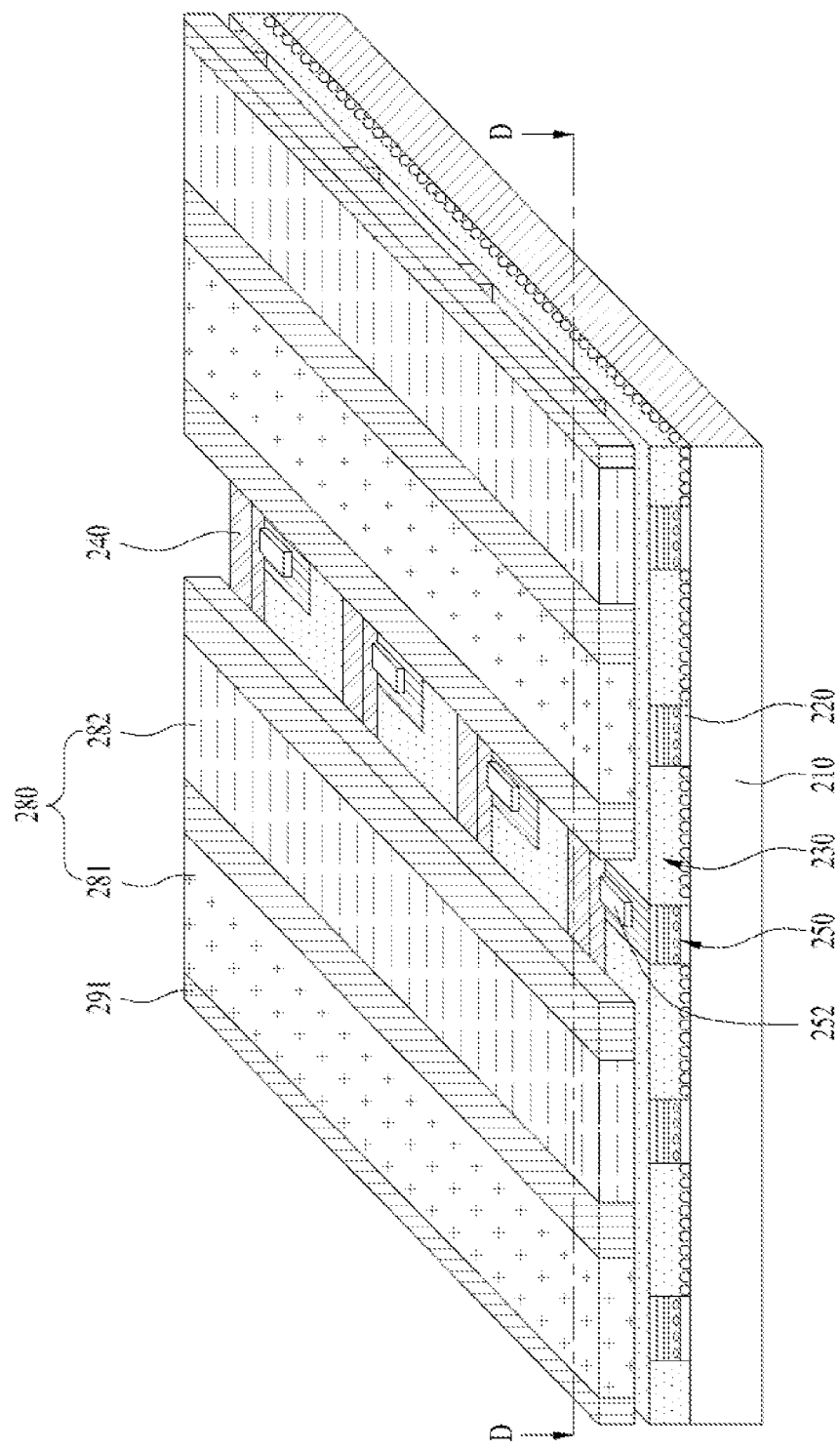
FIG. 7 is a perspective diagram of a display device using a semiconductor light-emitting element according to another embodiment of the present disclosure.
Figure 8:
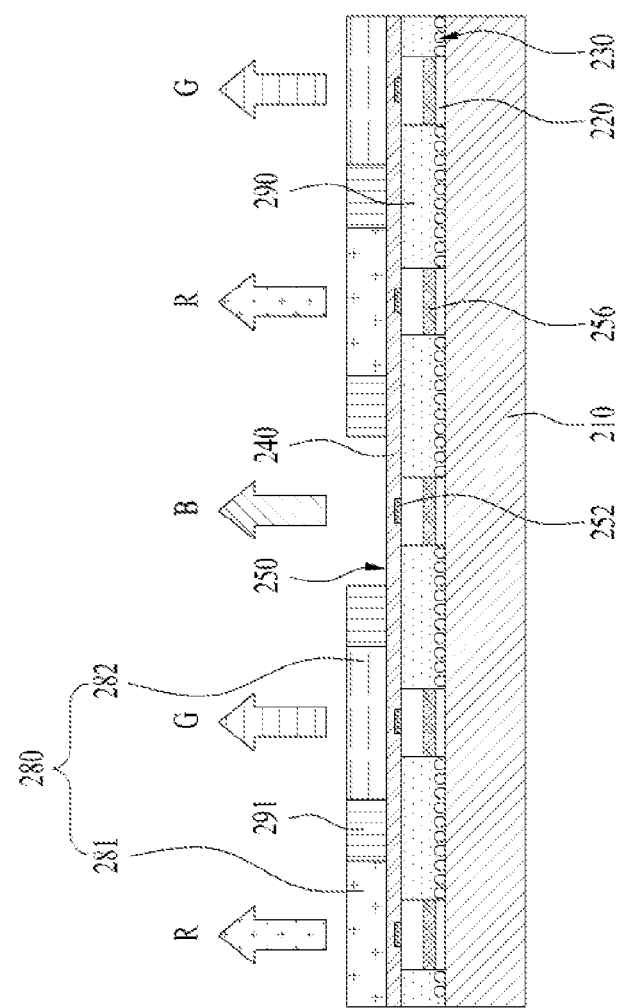
FIG. 8 is a cross-sectional diagram taken along a cutting line D-D shown in FIG. 8.
Figure 9:
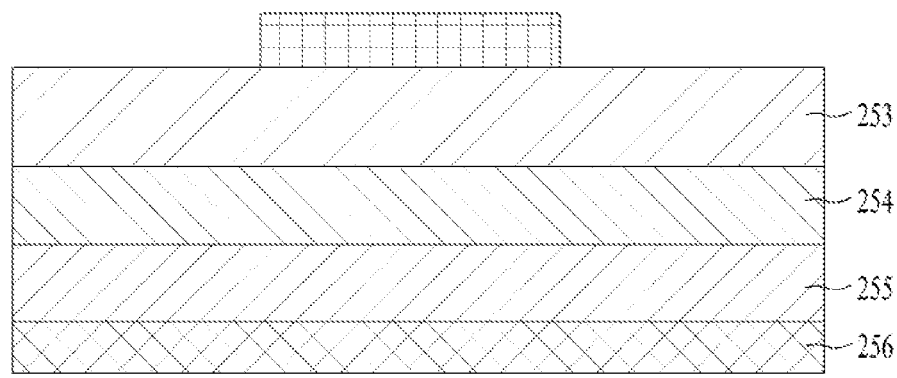
FIG. 9 is a conceptual diagram showing a vertical type semiconductor light-emitting element shown in FIG. 8.

FIG. 7 is a perspective diagram of a display device using a semiconductor light-emitting element according to another embodiment of the present disclosure, FIG. 8 is a cross-sectional diagram taken along a cutting line D-D shown in FIG. 8, and FIG. 9 is a conceptual diagram showing a vertical type semiconductor light-emitting element shown in FIG. 8.

Referring to the present drawings, a display device may employ a vertical semiconductor light-emitting element of a Passive Matrix (PM) type.

The display device includes a substrate 210, a first electrode 220, a conductive adhesive layer 230, a second electrode 240 and at least one semiconductor light-emitting element 250.

The substrate 210 is a wiring substrate on which the first electrode 220 is disposed and may contain polyimide (PI) to implement a flexible display device. Besides, the substrate 210 may use any substance that is insulating and flexible.

The first electrode 210 is located on the substrate 210 and may be formed as a bar type electrode that is long in one direction. The first electrode 220 may be configured to play a role as a data electrode.

The conductive adhesive layer 230 is formed on the substrate 210 where the first electrode 220 is located. Like a display device to which a light-emitting element of a flip chip type is applied, the conductive adhesive layer 230 may include one of an Anisotropic Conductive Film (ACF), an anisotropic conductive paste, a conductive particle contained solution and the like. Yet, in the present embodiment, a case of implementing the conductive adhesive layer 230 with the anisotropic conductive film is exemplified.

After the conductive adhesive layer has been placed in the state that the first electrode 220 is located on the substrate 210, if the semiconductor light-emitting element 250 is connected by applying heat and pressure thereto, the semiconductor light-emitting element 250 is electrically connected to the first electrode 220. In doing so, the semiconductor light-emitting element 250 is preferably disposed to be located on the first electrode 220.

If heat and pressure is applied to an anisotropic conductive film, as described above, since the anisotropic conductive film has conductivity partially in a thickness direction, the electrical connection is established. Therefore, the anisotropic conductive film is partitioned into a conductive portion and a non-conductive portion.

Furthermore, since the anisotropic conductive film contains an adhesive component, the conductive adhesive layer 230 implements mechanical coupling between the semiconductor light-emitting element 250 and the first electrode 220 as well as mechanical connection.

Thus, the semiconductor light-emitting element 250 is located on the conductive adhesive layer 230, via which an individual pixel is configured in the display device. As the semiconductor light-emitting element 250 has excellent luminance, an individual unit pixel may be configured in small size as well. Regarding a size of the individual semiconductor light-emitting element 250, a length of one side may be equal to or smaller than 80 μm for example and the individual semiconductor light-emitting element 250 may include a rectangular or square element. For example, the rectangular element may have a size equal to or smaller than 20 μm×80 μm.

The semiconductor light-emitting element 250 may have a vertical structure.

Among the vertical type semiconductor light-emitting elements, a plurality of second electrodes 240 respectively and electrically connected to the vertical type semiconductor light-emitting elements 250 are located in a manner of being disposed in a direction crossing with a length direction of the first electrode 220.

Referring to FIG. 9, the vertical type semiconductor light-emitting element 250 includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on then-type semiconductor layer 253. In this case, the p-type electrode 256 located on a bottom side may be electrically connected to the first electrode 220 by the conductive adhesive layer 230, and the n-type electrode 252 located on a top side may be electrically connected to a second electrode 240 described later. Since such a vertical type semiconductor light-emitting element 250 can dispose the electrodes at top and bottom, it is considerably advantageous in reducing a chip size.

Referring to FIG. 8 again, a phosphor layer 280 may formed on one side of the semiconductor light-emitting element 250. For example, the semiconductor light-emitting element 250 may include a blue semiconductor light-emitting element 251 emitting blue (B) light, and a phosphor layer 280 for converting the blue (B) light into a color of a unit pixel may be provided. In this regard, the phosphor layer 280 may include a red phosphor 281 and a green phosphor 282 configuring an individual pixel.

Namely, at a location of configuring a red unit pixel, the red phosphor 281 capable of converting blue light into red (R) light may be stacked on a blue semiconductor light-emitting element. At a location of configuring a green unit pixel, the green phosphor 282 capable of converting blue light into green (G) light may be stacked on the blue semiconductor light-emitting element. Moreover, the blue semiconductor light-emitting element may be singly usable for a portion that configures a blue unit pixel. In this case, the unit pixels of red (R), green (G) and blue (B) may configure a single pixel.

Yet, the present disclosure is non-limited by the above description. In a display device to which a light emitting element of a flip chip type is applied, as described above, a different structure for implementing blue, red and green may be applicable.

Regarding the present embodiment again, the second electrode 240 is located between the semiconductor light-emitting elements 250 and connected to the semiconductor light-emitting elements electrically. For example, the semiconductor light-emitting elements 250 are disposed in a plurality of columns, and the second electrode 240 may be located between the columns of the semiconductor light-emitting elements 250.

Since a distance between the semiconductor light-emitting elements 250 configuring the individual pixel is sufficiently long, the second electrode 240 may be located between the semiconductor light-emitting elements 250.

The second electrode 240 may be formed as an electrode of a bar type that is long in one direction and disposed in a direction vertical to the first electrode.

In addition, the second electrode 240 and the semiconductor light-emitting element 250 may be electrically connected to each other by a connecting electrode protruding from the second electrode 240. Particularly, the connecting electrode may include a n-type electrode of the semiconductor light-emitting element 250. For example, the n-type electrode is formed as an ohmic electrode for ohmic contact, and the second electrode covers at least one portion of the ohmic electrode by printing or deposition. Thus, the second electrode 240 and the n-type electrode of the semiconductor light-emitting element 250 may be electrically connected to each other.

Referring to FIG. 8 again, the second electrode 240 may be located on the conductive adhesive layer 230. In some cases, a transparent insulating layer (not shown) containing silicon oxide (SiOx) and the like may be formed on the substrate 210 having the semiconductor light-emitting element 250 formed thereon. If the second electrode 240 is placed after the transparent insulating layer has been formed, the second electrode 240 is located on the transparent insulating layer. Alternatively, the second electrode 240 may be formed in a manner of being spaced apart from the conductive adhesive layer 230 or the transparent insulating layer.

If a transparent electrode of Indium Tin Oxide (ITO) or the like is sued to place the second electrode 240 on the semiconductor light-emitting element 250, there is a problem that ITO substance has poor adhesiveness to an n-type semiconductor layer. Therefore, according to the present disclosure, as the second electrode 240 is placed between the semiconductor light-emitting elements 250, it is advantageous in that a transparent electrode of ITO is not used. Thus, light extraction efficiency can be improved using a conductive substance having good adhesiveness to an n-type semiconductor layer as a horizontal electrode without restriction on transparent substance selection.

Referring to FIG. 8 again, a partition 290 may be located between the semiconductor light-emitting elements 250. Namely, in order to isolate the semiconductor light-emitting element 250 configuring the individual pixel, the partition 290 may be disposed between the vertical type semiconductor light-emitting elements 250. In this case, the partition 290 may play a role in separating the individual unit pixels from each other and be formed with the conductive adhesive layer 230 as an integral part. For example, by inserting the semiconductor light-emitting element 250 in an anisotropic conductive film, a base member of the anisotropic conductive film may form the partition.

In addition, if the base member of the anisotropic conductive film is black, the partition 290 may have reflective property as well as a contrast ratio may be increased, without a separate block insulator.

For another example, a reflective partition may be separately provided as the partition 190. The partition 290 may include a black or white insulator depending on the purpose of the display device.

In case that the second electrode 240 is located right onto the conductive adhesive layer 230 between the semiconductor light-emitting elements 250, the partition 290 may be located between the vertical type semiconductor light-emitting element 250 and the second electrode 240 each. Therefore, an individual unit pixel may be configured using the semiconductor light-emitting element 250. Since a distance between the semiconductor light-emitting elements 250 is sufficiently long, the second electrode 240 can be placed between the semiconductor light-emitting elements 250. And, it may bring an effect of implementing a flexible display device having HD image quality.

In addition, as shown in FIG. 8, a black matrix 291 may be disposed between the respective phosphors for the contrast ratio improvement. Namely, the black matrix 291 may improve the contrast between light and shade.

In the display device using the semiconductor light-emitting element of the present disclosure described above, the semiconductor light-emitting element grown on a wafer is placed on a wiring substrate in the flip-chip form and used as an individual pixel.

Therefore, there is a problem in that it is difficult to implement a large screen display due to a size limitation of a wafer. Another embodiment of the present disclosure for solving such a problem will be described later in detail with reference to FIGS. 10 to 21.

Further, for example, although a display device to which a horizontal type semiconductor light-emitting element self-assembled in a fluid is applied will be mainly described, the scope of the present disclosure is not necessarily limited thereto.

Figure 10:
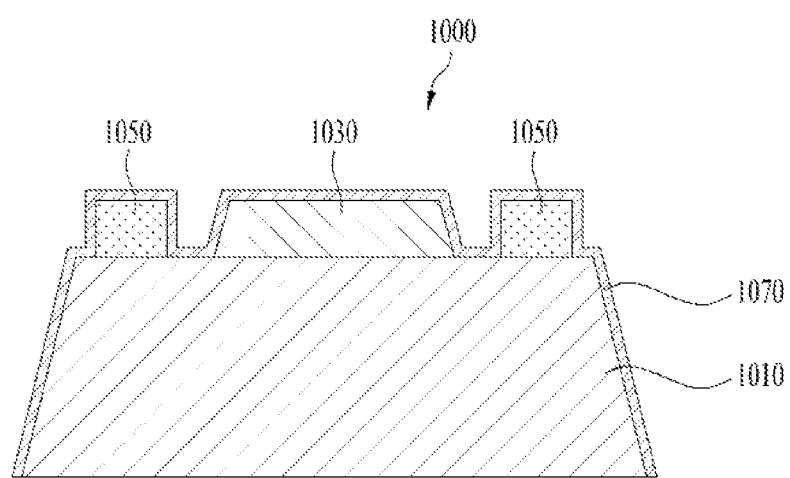
FIG. 10 is a diagram schematically illustrating a structure of a semiconductor light-emitting element according to another embodiment of the present disclosure.

FIG. 10 is a diagram schematically illustrating a structure of a semiconductor light-emitting element according to another embodiment of the present disclosure.

In following drawings, a description will be achieved assuming that a semiconductor light-emitting element 1000 is the horizontal type semiconductor light-emitting element. However, an embodiment of the present disclosure may not be limited to the horizontal type semiconductor light-emitting element, and may be similarly applied to the vertical type semiconductor light-emitting element.

In addition, in the following drawings, an upward direction of the semiconductor light-emitting element 1000 may mean a direction toward a magnetic layer 1050, and a downward direction may mean a direction toward a second conductivity type semiconductor layer 1010. In this case, light extracted from the semiconductor light-emitting element 1000 may be emitted to the outside through an upper portion of the semiconductor light-emitting element 1000.

As shown in FIG. 10, the semiconductor light-emitting element 1000 may include the second conductivity type semiconductor layer 1010 and a first conductivity type semiconductor layer 1030 formed on top of the second conductivity type semiconductor layer 1010. An active layer (not shown) may be formed between the first conductivity type semiconductor layer 1030 and the second conductivity type semiconductor layer 1010.

Each of the first conductivity type semiconductor layer 1030 and the second conductivity type semiconductor layer 1010 may contain gallium nitride (GaN) or gallium arsenide (GaAs) as a main material, and may contain a material such as indium (In), aluminum (Al), and the like added thereto to emit light of various colors.

In one example, the semiconductor light-emitting element 1000 may include the magnetic layer 1050 having a magnetic body. The magnetic layer 1050 may contain a metal having a magnetic property such as nickel (Ni) and the like.

It is shown in FIG. 10 that the magnetic layer 1050 is disposed on top of the second conductivity type semiconductor layer 1010, but the placement position of the magnetic layer 1050 may be changed based on a method for manufacturing the semiconductor light-emitting element 1000.

In addition, when one of the first conductivity type semiconductor layer 1030 and the second conductivity type semiconductor layer 1010 is an n-type semiconductor layer, the other is constructed as a p-type semiconductor layer and has a structure of a pn diode.

As will be described later with reference to FIG. 11, the semiconductor light-emitting element 1000 may be put into the fluid to be assembled onto the substrate. Because the semiconductor light-emitting element 1000 put into the fluid includes the magnetic layer 1050, the semiconductor light-emitting element 1000 may move to the substrate by a magnetic field and be assembled onto the substrate.

In one example, a passivation layer 1070 may be formed to surround a top surface and side surfaces of the semiconductor light-emitting element 1000. Because the passivation layer 1070 is formed in a state in which the semiconductor light-emitting element 1000 is connected to a growth substrate (not shown), the passivation layer 1070 may not be formed on a bottom surface of the semiconductor light-emitting element 1000. However, this is an exemplary case, and the present disclosure is not limited thereto.

The passivation layer 1070 may be formed using an inorganic insulator such as silica, alumina, and the like through a plasma enhanced chemical vapor deposition (PECVD), a low pressure chemical vapor deposition (LPCVD), a sputtering deposition, and the like, or may be formed through a method of spin coating an organic material such as a photoresist or a polymer material.

In one example, a first conductivity type electrode may be connected to the first conductivity type semiconductor layer 1030, and a second conductivity type electrode may be connected to the second conductivity type semiconductor layer 1010. To this end, for example, some regions of the first conductivity type semiconductor layer 1030 and the second conductivity type semiconductor layer 1010 must be exposed to the outside. Accordingly, in a subsequent manufacturing process of the display device, some regions of the passivation layer 1070 may be etched.

Figure 11:
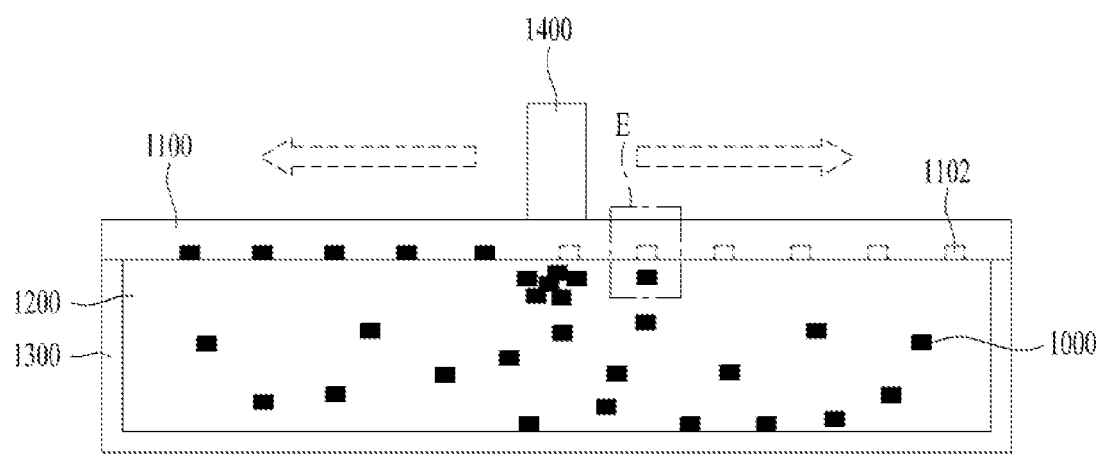
FIG. 11 is a diagram illustrating an embodiment of a method in which a semiconductor light-emitting element having a structure shown in FIG. 10 is assembled onto a substrate by a self-assembly scheme.

FIG. 11 is a diagram illustrating an embodiment of a method in which a semiconductor light-emitting element having a structure shown in FIG. 10 is assembled onto a substrate by a self-assembly scheme.

Figure 12:
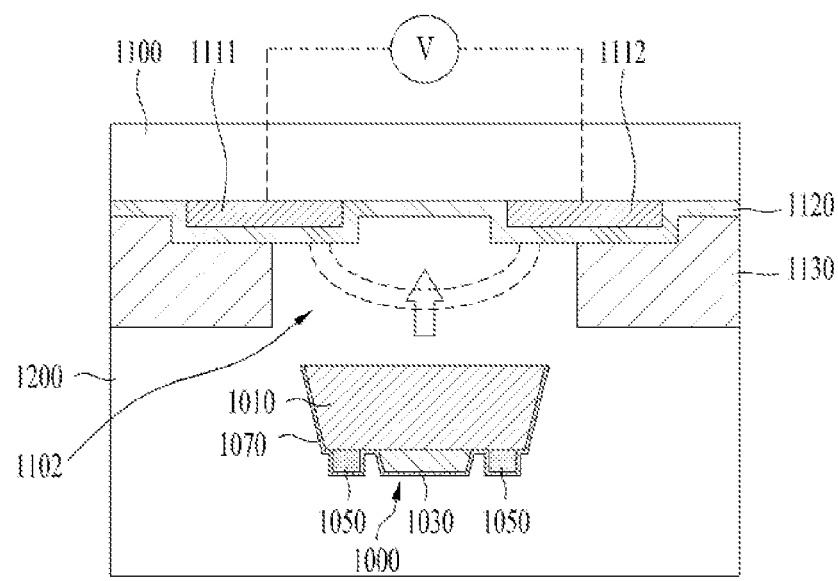
FIG. 12 is an enlarged view of a portion E in FIG. 11.

In addition, FIG. 12 is an enlarged view of a portion E in FIG. 11.

FIGS. 11 to 12 will briefly describe an example in which the semiconductor light-emitting element is assembled onto the substrate by the self-assembly scheme using the electromagnetic field.

Referring to FIGS. 11 and 12, the semiconductor light-emitting element 1000 may be put into a chamber 1300 filled with a fluid 1200.

Thereafter, a substrate 1100 may be disposed on top of the chamber 1300. According to an embodiment, the substrate 1100 may be put into the chamber 1300.

A pair of electrodes 1111 and 1112 corresponding to each semiconductor light-emitting element 1000 to be assembled may be formed on the substrate 1100. The electrodes 1111 and 1112 may be implemented as a transparent electrode (ITO) or may be implemented using other common materials. The electrodes 1111 and 1112 generate an electric field as a voltage is applied, so that the electrodes 1111 and 1112 correspond to assembly electrodes stably fixing the semiconductor light-emitting element 1000 in contact with an assembly hole 1102.

A distance between the electrodes 1111 and 1112 is smaller than, for example, a width of the semiconductor light-emitting element 1000 and a width of the assembly hole 1102, so that an assembly position of the semiconductor light-emitting element 1000 using the electric field may be more precisely fixed.

An insulating layer 1120 may be formed on the electrodes 1111 and 1112 to protect the electrodes 1111 and 1112 from the fluid 1200 and prevent leakage of current flowing through the electrodes 1111 and 1112. For example, the insulating layer 1120 may be formed of a single layer or multiple layers of an inorganic insulator, such as silica, alumina, and the like, or an organic insulator. The insulating layer 1120 may have a minimum thickness for preventing damage to the electrodes 1111 and 1112 when assembling the semiconductor light-emitting element 1000, and may have a maximum thickness for stably assembly of the semiconductor light-emitting element 1000.

A partition wall 1130 may be formed on top of the insulating layer 1120. Some regions of the partition wall 1130 may be positioned on top of the electrodes 1111 and 1112, and the remaining regions thereof may be positioned on top of the substrate 1100.

For example, when manufacturing the substrate 1100, as a portion of the partition wall formed on top of the entire insulating layer 1120 is removed, the assembly hole 1102 in which each semiconductor light-emitting element 1000 is coupled to the substrate 1100 may be defined.

The assembly holes 1102 to which the semiconductor light-emitting elements 1000 are respectively coupled may be defined in the substrate 1100, and a surface in which the assembly hole 1102 is defined may be in contact with the fluid 1200. The assembly hole 1102 may guide a precise assembly position of the semiconductor light-emitting element 1000.

In one example, the assembly hole 1102 may have a shape and a size corresponding to that of the semiconductor light-emitting element 1000 to be assembled. Accordingly, it is possible to prevent assembly of another semiconductor light-emitting element or a plurality of semiconductor light-emitting elements into the assembly hole 1102.

In addition, a depth of the assembly hole 1102 is greater than a vertical height of the semiconductor light-emitting element 1000, so that once the semiconductor light-emitting element 1000 is assembled, it is difficult for the semiconductor light-emitting element 1000 to deviate thereafter.

After the substrate 1100 is disposed, an assembly apparatus 1400 including the magnetic body may move along the substrate 1100. The assembly apparatus 1400 may move while being in contact with the substrate 1100 in order to maximize a region exerted by the magnetic field into the fluid 1200. For example, the assembling apparatus 1400 may include a plurality of magnetic bodies or a magnetic body having a size corresponding to that of the substrate 1100. In this case, a moving distance of the assembling apparatus 1400 may be limited within a predetermined range.

By the magnetic field generated by the assembly apparatus 1400, the semiconductor light-emitting element 1000 in the chamber 1300 may move toward the assembly apparatus 1400.

The semiconductor light-emitting element 1000 may come into contact with the substrate 1100 by entering the assembly hole 1102 while moving toward the assembly apparatus 1400. For example, the assembly hole 1102 and/or the semiconductor light-emitting element 1000 may have a pattern, a shape, or the like for the second conductivity type semiconductor layer 1010 of the semiconductor light-emitting element 1000 to be in contact with the substrate 1100.

In addition, it is possible to prevent a phenomenon in which e semiconductor light-emitting element 1000 in contact with the substrate 1100 deviates by the movement of the assembly apparatus 1400 with the electric field generated by the assembly electrodes 1111 and 1112 of the substrate 1100.

That is, a time required for assembling the semiconductor light-emitting elements onto the substrate may be drastically reduced with the self-assembly scheme using the electromagnetic field described above, so that a large-area, high-pixel display may be implemented more quickly and economically.

However, in the case of the self-assembly scheme, a horizontal length of the semiconductor light-emitting element to be assembled should be smaller than the width of the assembly hole. When the horizontal length of the semiconductor light-emitting element is greater than the width of the assembly hole, the semiconductor light-emitting element will not be assembled into the assembly hole. In addition, for example, when the horizontal length of the semiconductor light-emitting element is almost equal to the width of the assembly hole, the semiconductor light-emitting element may be precisely assembled, but the assembly time will increase rapidly.

Therefore, the semiconductor light-emitting element is assembled into the assembly hole while the horizontal length of the semiconductor light-emitting element has an appropriate difference from the width of the assembly hole. Experimentally, it was identified that it is effective in terms of the assembly time for the width of the assembly hole to be 55 μm, and to have a gap within approximately 5 μm when, in the horizontal type semiconductor light-emitting element, the horizontal length of the semiconductor light-emitting element is 50 μm.

However, although such gap provides efficient assembly time, such gap may cause new problems in a process such as etching, electrode connection, or the like performed after the assembly of semiconductor light-emitting element. For example, in an operation of mass production management of the display device, an error range of electrode placement should be managed up to a level of ±3 μm, which is the most important key factor in a panel process yield.

For example, when the horizontal length of the semiconductor light-emitting element is 5 μm smaller than the width of the assembly hole, an error range of the assembly gap may be up to 5 μm. In addition, in a subsequent wiring process, the error range acts as an arrangement error of electrode formation as it is, so that the level of ±3 μm, which is the appropriate error range, may be exceeded, thereby increasing a probability of occurrence of short and open defects.

A display device and a method for manufacturing the same according to an embodiment of the present disclosure for solving the above-described problem will be described below with reference to FIGS. 13 to 21.

Figure 13:
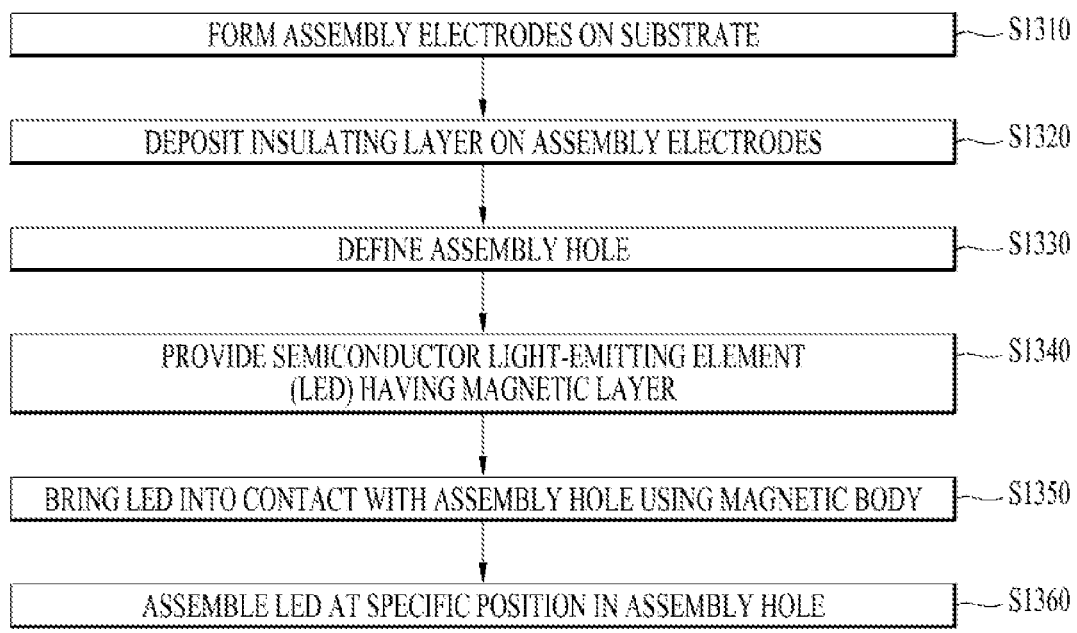
FIG. 13 is a flowchart specifically illustrating a method for manufacturing a display device according to another embodiment of the present disclosure.

FIG. 13 is a flowchart specifically illustrating a method for manufacturing a display device according to another embodiment of the present disclosure.

First, the assembly electrodes are formed on the substrate (S1310). The substrate may be the flexible substrate. For example, in order to implement the flexible display device, the substrate may contain glass or polyimide (PI).

In addition, the assembly electrode may be implemented as, for example, a transparent electrode (ITO), a single layer of molybdenum, or a multilayer structure of molybdenum and aluminum.

In addition, the pair of assembly electrodes are constructed to cause a voltage difference between the assembly electrodes.

A primary goal of forming the assembly electrode is to induce a dielectrophoresis (DEP) phenomenon by an electric field during the self-assembly to fix the semiconductor light-emitting element into the assembly hole.

The dielectrophoresis phenomenon refers to a phenomenon in which, when polarizable particles exist in a non-uniform electric field, the polarizable particles are attracted toward a region with a large electric field or a region with a small electric field.

In the present disclosure, a role of the assembly electrodes is not simply to fix the semiconductor light-emitting element in the assembly hole, but to set the semiconductor light-emitting element to be assembled at a specific position in the assembly hole by adjusting the placement or the shape thereof. A specific embodiment therefor will be described later in FIG. 14.

When the assembly electrodes are formed on the substrate, the insulating layer is deposited thereon (S1320). As described above, the insulating layer protects the assembly electrodes from the fluid during the self-assembly and prevents the leakage current in the process of applying the voltage to the assembly electrode.

Thereafter, the assembly hole is defined in an upper portion of the insulating layer (S1330), and the substrate is placed on the chamber filled with fluid.

In the process of defining the assembly hole, for example, the assembly hole is defined at a position overlapping with at least one of the pair of assembly electrodes.

In addition, in the process of defining the assembly hole, a metal reflective film may be formed beneath the assembly hole. The metal reflective film may include a plurality of layers having different refractive indices to reflect light emitted downwardly of the semiconductor light-emitting element. In addition, in the plurality of layers, a material having a relatively high refractive index and a material having a low refractive index may be repeatedly stacked.

In addition, an adhesive layer for stably fixing the semiconductor light-emitting element may be included beneath the assembly hole. The adhesive layer may be, for example, made of an organic material such as polydimethylsiloxane (PDMS), polyethylene terephthalate (PET), or a polyurethane film.

Thereafter, the semiconductor light-emitting element (LED) having the magnetic layer is provided in the fluid in which the substrate having the assembly hole defined therein is located (S1340). Thereafter, the semiconductor light-emitting element (LED) is brought into contact with the assembly hole using the assembly apparatus having the magnetic body on top of the substrate (S1350).

The semiconductor light-emitting element is, for example, an LED (a micro-LED) having a size on the order of micrometers for realizing the large-area display device.

In addition, the pair of assembly electrodes formed below the assembly hole generate the non-uniform electric field in the assembly hole by the application of the voltage to allow the semiconductor light-emitting element (LED) to move in a specific direction to be assembled at the specific position in the assembly hole (S1360).

In the assembly process (S1360), for example, an alternating voltage may be applied to one of the pair of assembly electrodes, and the other may be grounded to generate the electric field between the two assembly electrodes.

A dielectric polarization phenomenon occurs in the non-polarized semiconductor light-emitting element by a difference in the voltage applied to the pair of assembly electrodes. Thereafter, while the voltage is applied, the non-polarized semiconductor light-emitting element becomes to have a property of a polarized particle to be affected by a dielectrophoresis force (DEP force).

In addition, the alternating voltage may be varied in a range from 5 V to 20 V. An excessive amount of applied voltage may cause a diode operation of the semiconductor light-emitting element to be directly or indirectly assembled, so that it is desirable to restrain the excessive amount of applied voltage.

In addition, an operation of forming a wiring electrode electrically connected to the semiconductor light-emitting element on the substrate on which the semiconductor light-emitting element is assembled may be added.

In addition, an operation of, using the substrate as a first substrate, transferring the semiconductor light-emitting element assembled onto the first substrate to a second substrate may be added. In this case, the second substrate may be a donor substrate for transfer to another substrate, and may be a wiring substrate or a final substrate on which the wiring electrode is already formed. A transistor for driving an active matrix may be provided on the final substrate.

In addition, the transferring operation may include an operation of forming the wiring electrode and the conductive adhesive layer on the second substrate, and an alignment operation of attaching the first substrate to the conductive adhesive layer such that the semiconductor light-emitting element of the first substrate is aligned with the wiring electrode.

The alignment operation is performed by, for example, horizontally and then vertically moving one of the donor substrate and the wiring substrate with respect to the other. Thereafter, whether the semiconductor light-emitting element of the donor substrate overlaps with an assembly groove of the wiring substrate corresponding to the semiconductor light-emitting element is inspected by a camera sensor or the like, and the semiconductor light-emitting element is assembled to be fitted into the assembly groove when the semiconductor light-emitting element overlaps with the assembly groove.

Figure 14:
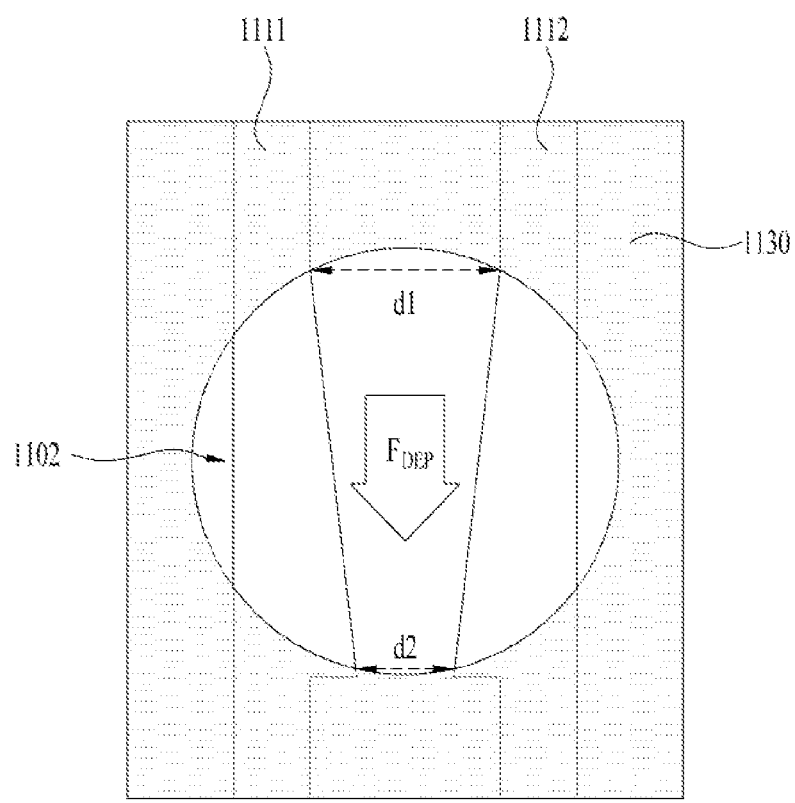
FIG. 14 is a view showing one embodiment of assembly electrodes for forming a non-uniform electric field of FIG. 13.

FIG. 14 is a view showing one embodiment of assembly electrodes for forming a non-uniform electric field of FIG. 13.

As shown in FIG. 14, the pair of assembly electrodes 1111 and 1112 may overlap the assembly hole 1102 to be defined beneath the assembly hole 1102. The assembly hole 1102 is defined by being surrounded by the partition wall 1130.

The pair of assembly electrodes 1111 and 1112 may be arranged to be long in a vertical direction on the substrate, and a plurality of assembly holes may be defined on top of the assembly electrodes. However, the assembly electrodes overlapping the assembly hole have a pattern that allows the formation of the non-uniform electric field.

As shown in FIG. 14, the assembly electrodes 1111 and 1112 overlapping the assembly hole 1102 have a plurality of separation distances d1 and d2 therebetween. A separation distance d1 is greater than a separation distance d2. That is, the assembly electrodes 1111 and 1112 are not arranged horizontally at least inside the assembly hole.

When the voltage is applied to the assembly electrodes, for example, when an AC voltage is applied to a first assembly electrode 1111 and a second assembly electrode 1112 is grounded, the dielectrophoresis force (DEP force) acts in a direction from d1 to d2 in the assembly hole 1102.

Figure 15:
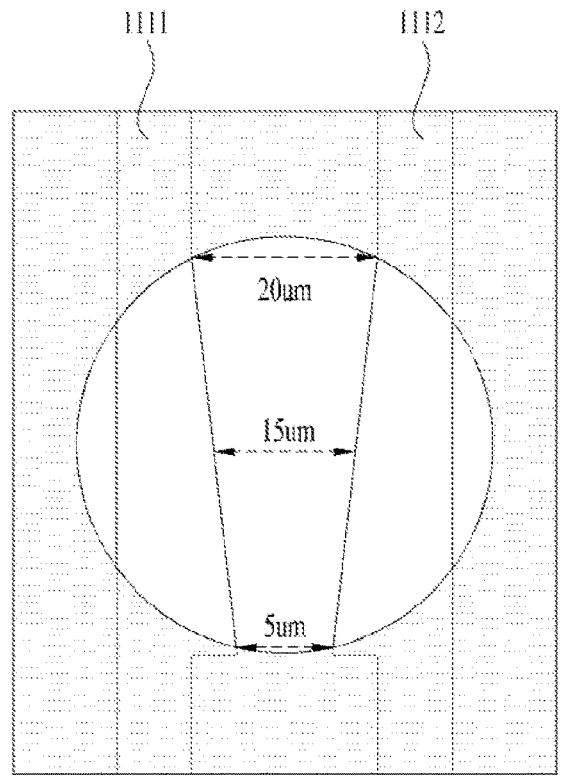
FIG. 15 is a diagram showing a strength of an electric field based on a separation distance between assembly electrodes, based on assembly electrodes shown in FIG. 14.
Figure 15:
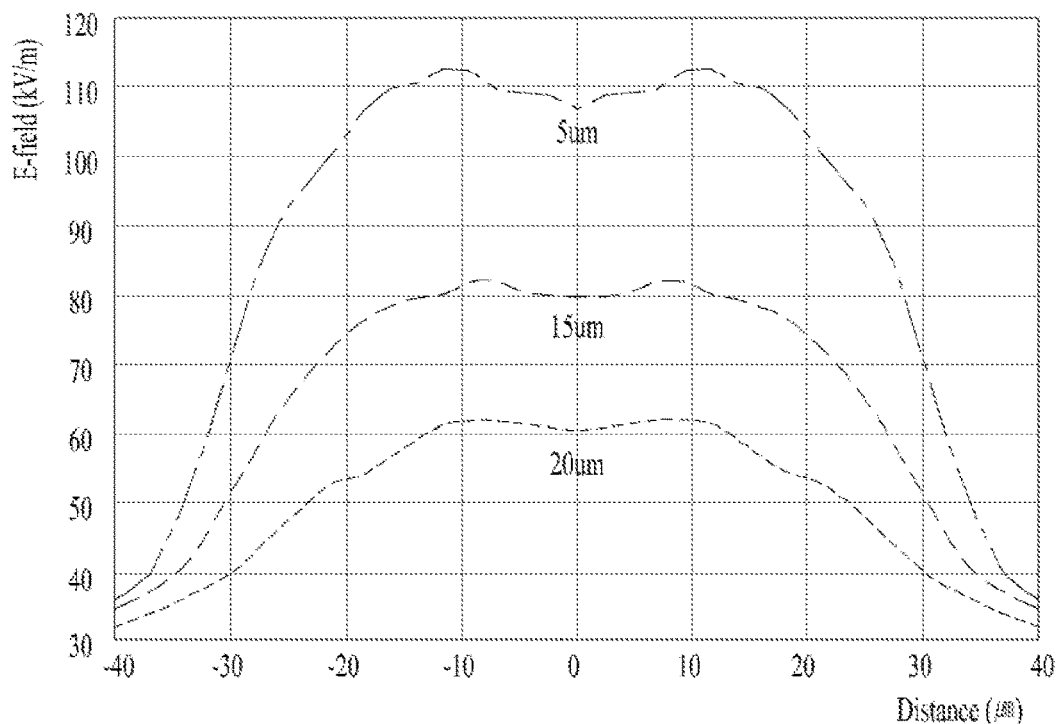

FIG. 15 is a diagram showing a strength of an electric field based on a separation distance between assembly electrodes, based on assembly electrodes shown in FIG. 14.

In one embodiment, as shown in (a) in FIG. 15, the separation distance between the assembly electrodes 1111 and 1112 is reduced in a downward direction.

(b) in FIG. 15 is a simulation graph showing the strength of the electric field based on the separation distance (20 μm, 15 μm, and 5 μm) between the assembly electrodes of (a) in FIG. 15.

As shown in (b) in FIG. 15, the smaller the separation distance between the assembly electrodes, the strength of the electric field formed between the assembly electrodes increases.

For example, when the separation distance between the assembly electrodes is 5 μm, an electric field having a strength of about 110 kV/m exists within a range of ±10 μm of the assembly electrodes. On the other hand, when the separation distance between the assembly electrodes is 20 μm, an electric field having a strength of about 60 kV/m exists within the range of ±10 μm of the assembly electrodes.

Therefore, the strength of the electric field becomes stronger in a direction from a position where the separation distance is 20 μm to a position where the separation distance is 5 μm, and the dielectrophoresis force is also directed in the direction from the position where the separation distance is 20 μm to the position where the separation distance is 5 μm.

Figure 16:
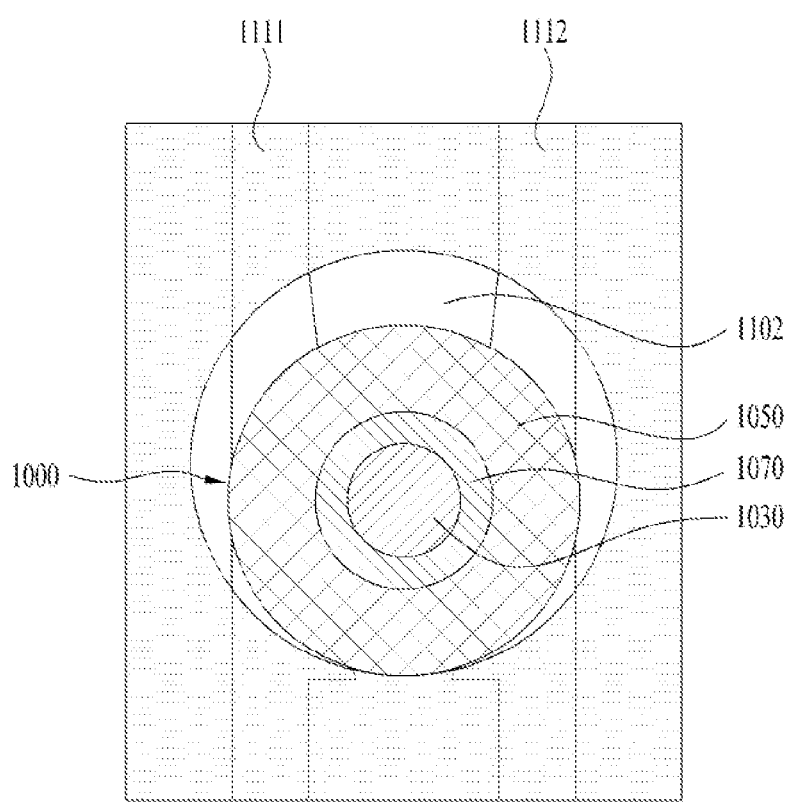
FIG. 16 is a diagram illustrating a semiconductor light-emitting element assembled into an assembly hole of a substrate having an assembly electrode of FIG. 14.

FIG. 16 is a diagram illustrating a semiconductor light-emitting element assembled into an assembly hole of a substrate having an assembly electrode of FIG. 14.

A horizontal type semiconductor light-emitting element of a circular shape having the first conductivity type semiconductor layer 1030, the insulating layer 1070, and the magnetic layer 1050 as shown in FIG. 16 when viewed from the top is an example of the semiconductor light-emitting element 1000. However, the present disclosure is not limited thereto.

In addition, the second conductivity type semiconductor layer is present beneath the magnetic layer 1050 in the semiconductor light-emitting element 1000.

Because the assembly hole 1102 has the assembly electrodes 1111 and 1112 as shown in FIG. 14, when the voltage is applied, the non-uniform electric field based on the separation distances of the assembly electrodes is generated in the assembly hole 1102. Specifically, the non-uniform electric field may occur in both a direction horizontal to the substrate and a direction perpendicular to the substrate in the assembly hole 1102, but the non-uniform electric field generated in the horizontal direction is important from a viewpoint of the assembly of the semiconductor light-emitting element. This is because the direction of the dielectrophoresis force (DEP force) in the assembly hole is determined by the non-uniform electric field generated in the horizontal direction. Specifically, the direction of the dielectrophoresis force corresponds to a direction toward a region where the strength of the electric field is great in the horizontal direction within the assembly hole.

In the case of the assembly electrodes in FIG. 16, the dielectrophoresis force is generated in the downward direction of the assembly hole 1102 (a direction toward a region below the assembly hole when viewed in a plan view). Therefore, when the semiconductor light-emitting element 1000 comes into contact with the assembly hole 1102 in the fluid, the semiconductor light-emitting element 1000 is positioned beneath the assembly hole 1102 by the dielectrophoresis force.

Figure 17:
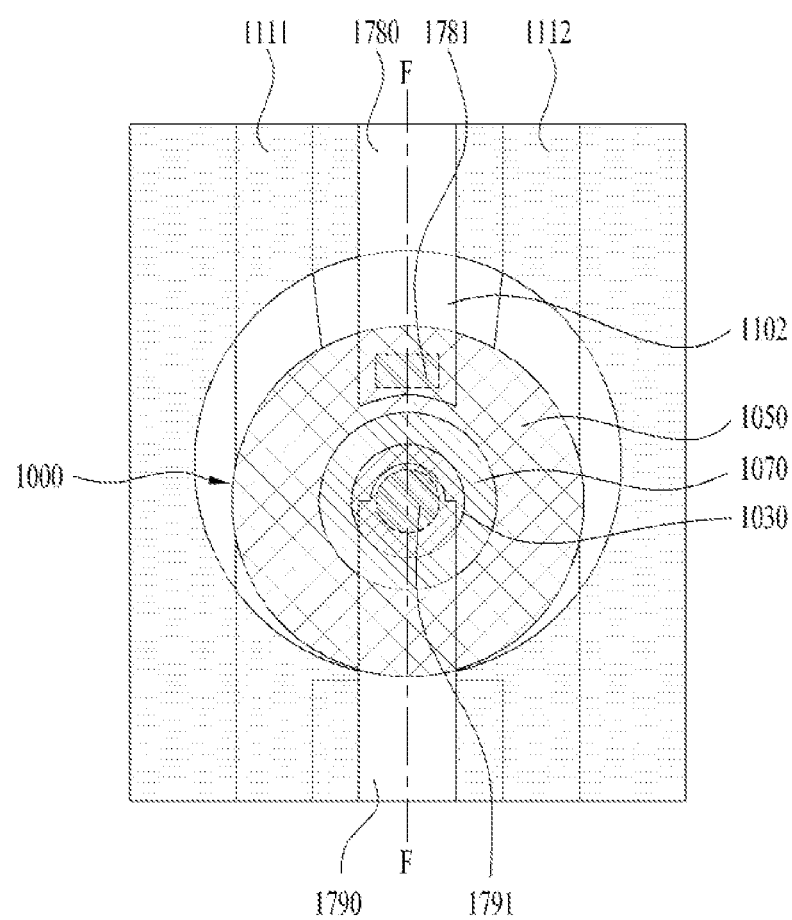
FIG. 17 is a plan view illustrating a shape after wiring electrodes are formed on top of a semiconductor light-emitting element of FIG. 16.

FIG. 17 is a plan view illustrating a shape after wiring electrodes are formed on top of a semiconductor light-emitting element of FIG. 16.

In a specific direction of the assembly hole 1102 having the pair of assembly electrodes 1111 and 1112, the semiconductor light-emitting element 1000 having the first conductivity type semiconductor layer 1030, the insulating layer 1070, and the magnetic layer 1050 is assembled. The specific direction coincides with the direction in which the dielectrophoresis force acts.

A second conductivity type electrode 1781 and a second wiring electrode 1780 electrically connected to the magnetic layer 1050 are formed on top of the semiconductor light-emitting element 1000. Because the second conductivity type semiconductor layer is located beneath the magnetic layer 1050, the second wiring electrode 1780 is for electrically connecting the second conductivity type semiconductor layer.

In addition, a first conductivity type electrode 1791 and a first wiring electrode 1790 electrically connected to the first conductivity type semiconductor layer 1030 are formed.

Figure 18:
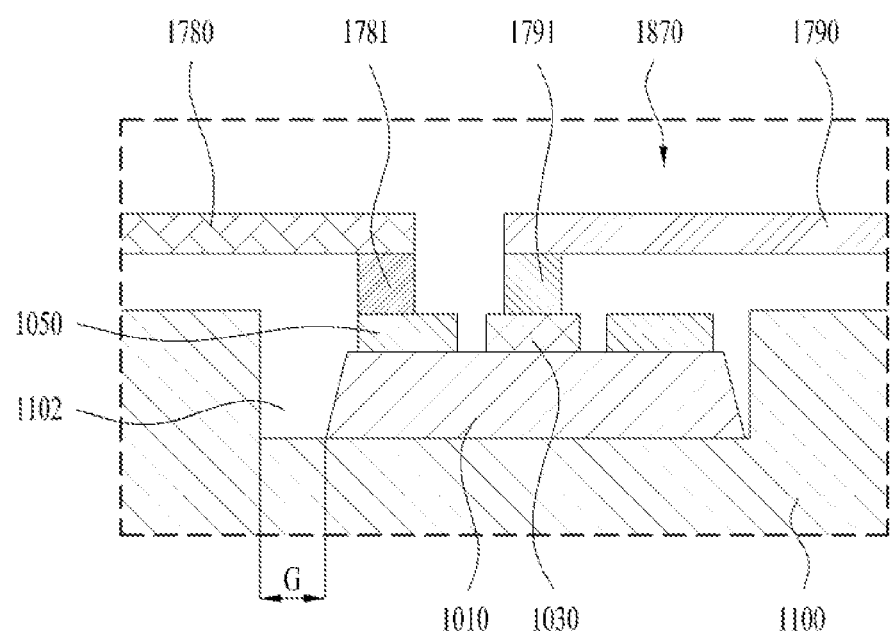
FIG. 18 is a cross-sectional view of a semiconductor light-emitting element on which wiring electrodes are formed, taken along a line F-F of FIG. 17.

FIG. 18 is a cross-sectional view of a semiconductor light-emitting element on which wiring electrodes are formed, taken along a line F-F of FIG. 17.

As shown in FIG. 18, the semiconductor light-emitting element having the first conductivity type semiconductor layer 1030, the second conductivity type semiconductor layer 1010, and the magnetic layer 1050 is assembled into the assembly hole 1102 of the substrate 1100. In addition, a planarization process for a wiring process is preceded on the upper portion of the semiconductor light-emitting element, and accordingly, an insulating material 1870 is deposited.

In addition, the semiconductor light-emitting element is assembled biased in one direction of the assembly hole 1102 under the influence of the dielectrophoresis force induced by the assembly electrodes, and has an assembly gap of G in a relationship with the assembly hole 1102.

A subsequent wiring process in consideration of the preset assembly gap of G may minimize the arrangement error that may occur during the electrode formation process.

For example, in realizing the display device using the semiconductor light-emitting element, a very large number of semiconductor light-emitting elements must be assembled into the assembly hole of the substrate. In addition, when the wiring process is performed on a very large number of semiconductor light-emitting elements, a batch electrode hole defining process for the plurality of elements rather than a process for individual elements is preceded. In the case of performing the etching process for defining the electrode hole, it is necessary to perform the etching at the exact positions of the first conductivity type semiconductor layer and the second conductivity type semiconductor layer. The wrong etching position is directly related to a defect such as the short in the subsequent wiring process.

In one example, when the plurality of semiconductor light-emitting elements are all assembled at the specific positions in the assembly hole with the same structure as the semiconductor light-emitting element shown in FIG. 18, the process of defining the electrode hole may be performed by collectively reflecting a difference between the preset assembly gaps without considering an error range of the assembly gap that occurs during the process of assembling the semiconductor light-emitting element.

Therefore, as shown in FIG. 18, the first conductivity type electrode 1791 and the first wiring electrode 1790 may be stably formed on the top of the first conductivity type semiconductor layer 1030, and the second conductivity type electrode 1781 and the second wiring electrode 1780 may be formed on top of the magnetic layer 1050

Figure 19:
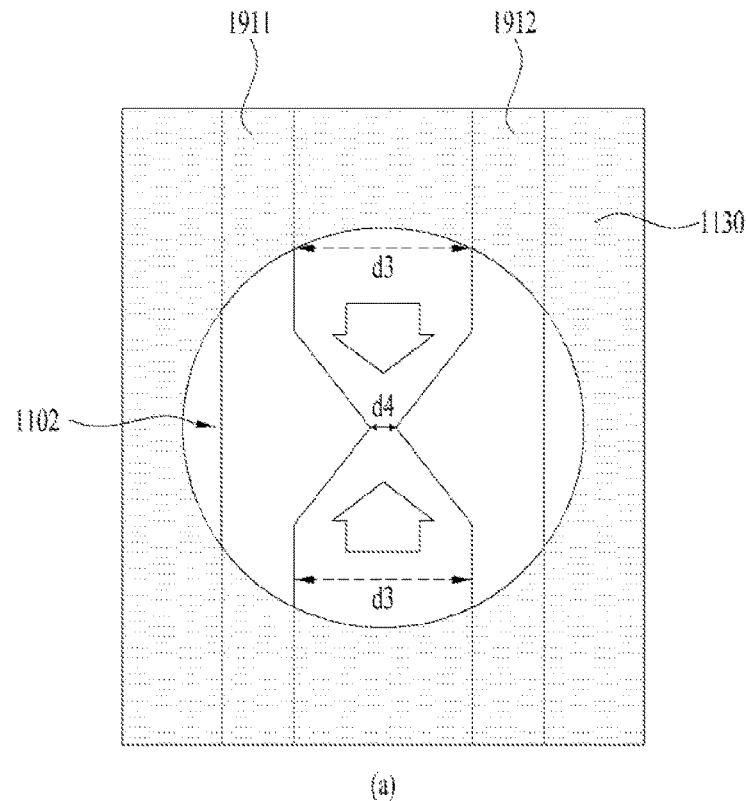
FIG. 19 is a diagram showing another embodiment of assembly electrodes for forming a non-uniform electric field.
Figure 19:
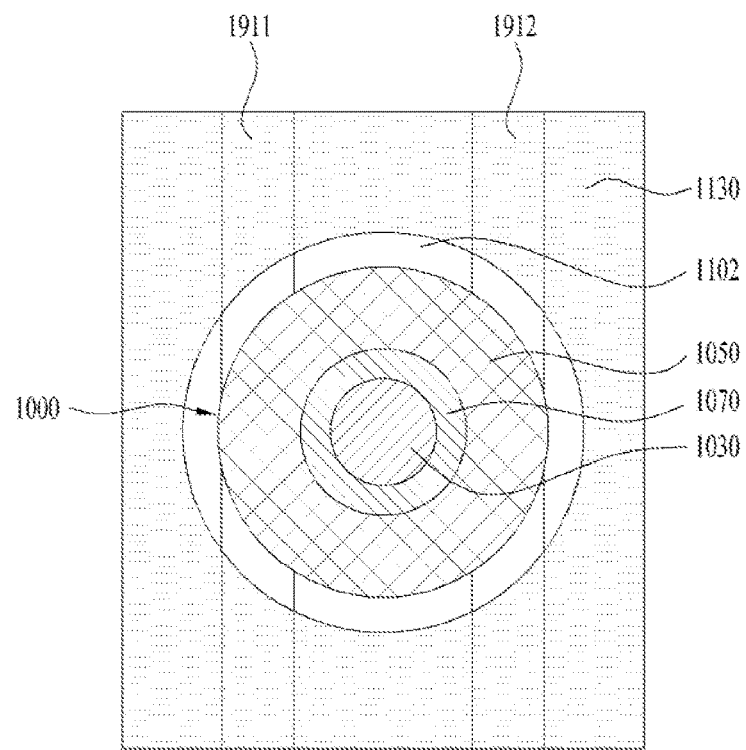

FIG. 19 is a diagram showing another embodiment of assembly electrodes for forming a non-uniform electric field.

While the dielectrophoresis force by the assembly electrodes shown in FIG. 14 was directed in one direction in the assembly hole, assembly electrodes 1911 and 1912 of FIG. 19 are designed such that the dielectrophoresis force acts in a direction toward a center of the assembly hole 1102. However, the present disclosure may not be limited to the embodiment, and may be designed such that, for example, assembly electrodes with a plurality of separation distances are formed, and the semiconductor light-emitting element is assembled in a direction of a separation distance having the minimum value among the separation distances.

(a) in FIG. 19 shows the assembly hole 1102 surrounded by the partition wall 1130 and the assembly electrodes 1911 and 1912 formed beneath the assembly hole 1102. A first assembly electrode 1911 and a second assembly electrode 1912 overlapping the assembly hole 1102 have a symmetrical structure, and have protrusions protruding toward the center of the assembly hole 1102.

In addition, a separation distance of the first assembly electrode 1911 and the second assembly electrode 1912 is smaller than the horizontal length of the semiconductor light-emitting element to be assembled.

In addition, in a case of separation distances d3 to d5 between the assembly electrodes, because a separation distance d4 between the protrusions is smaller than the other separation distances d3 and d5, the dielectrophoresis force is applied in a direction of the separation distance d4, which is the direction toward the center of the assembly hole 1102, when the voltage is applied to the assembly electrodes.

(b) in FIG. 19 shows the semiconductor light-emitting element 1000 having the first conductivity type semiconductor layer 1030, the insulating layer 1070, and the magnetic layer 1050 assembled into the assembly hole 1102 of the substrate on which the assembly electrodes 1911 and 1912 of (a) in FIG. 19 are formed. As described above, the dielectrophoresis force acts in the direction toward the center of the assembly hole 1102, and the semiconductor light-emitting element 1000 is assembled at the center of the assembly hole 1102.

Figure 20:
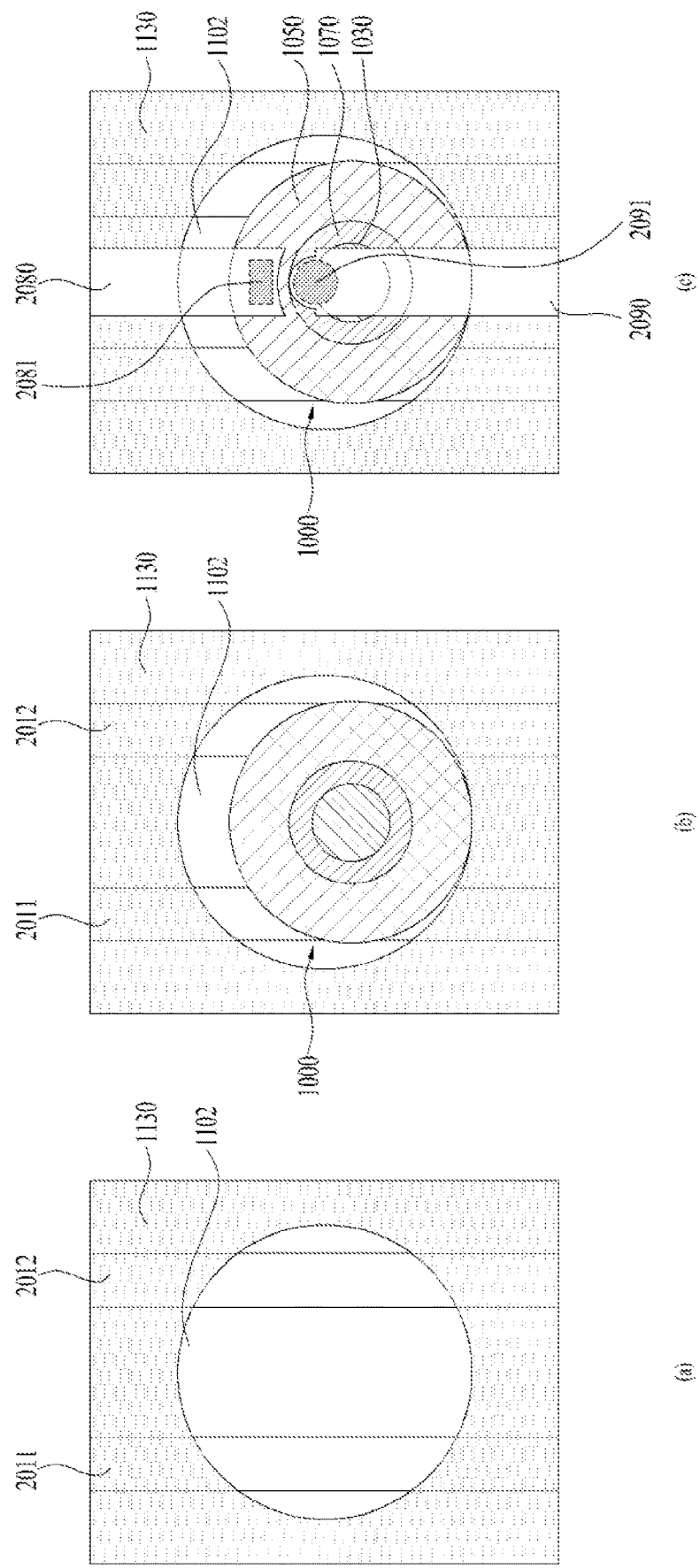
FIG. 20 is a diagram showing a shape of a conventional assembly electrode, a semiconductor light-emitting element accordingly assembled, and a defect phenomenon after formation of a wiring electrode.

FIG. 20 is a diagram showing a shape of a conventional assembly electrode, a semiconductor light-emitting element accordingly assembled, and a defect phenomenon after formation of a wiring electrode.

As shown in (a) in FIG. 20, conventionally, even when the semiconductor light-emitting element is assembled using the self-assembly scheme, assembly electrodes 2011 and 2012 are arranged horizontally in the vertical direction. Therefore, for example, even when the voltage is applied to the assembly electrodes 2011 and 2012, a uniform electric field is formed inside the assembly hole 1102 surrounded by the partition wall 1130.

(b) in FIG. 20 is a diagram illustrating the semiconductor light-emitting element 1000 fixed by the uniform electric field of (a) in FIG. 20. The semiconductor light-emitting element 1000 may be fixed at an arbitrary position of the partition wall 1130 and the assembly hole 1102. Accordingly, there may be an assembly gap equal to the difference between the horizontal length of the semiconductor light-emitting element 1000 and the width of the assembly hole 1102. Because the semiconductor light-emitting element 1000 is assembled into the assembly hole 1102 at an arbitrary assembly gap when the wiring process is performed thereafter, for example, the electrode hole for the wiring process is defined on the assumption that the semiconductor light-emitting element 1000 is located at the center of the assembly hole 1102.

(c) in FIG. 20 is a diagram showing a defect phenomenon that may appear after the subsequent wiring process is performed on the semiconductor light-emitting element 1000 assembled biased in one direction of the assembly hole 1102 as shown in (b) in FIG. 20. In this connection, the electrode hole is defined and the wiring process is performed on the assumption that, for example, the semiconductor light-emitting element is formed at the center of the assembly hole.

As shown in (c) in FIG. 20, a first conductivity type electrode 2091 and a first wiring electrode 2090 are formed at the center of the assembly hole 1102. In addition, a second conductivity type electrode 2080 and a second wiring electrode 2081 are also formed on top of the magnetic layer 1050 accordingly.

In a case of the second conductivity type electrode 2091, a region in which the electrode 2091 is formed is not accurately positioned on top of the first conductivity type semiconductor layer 1030 because the semiconductor light-emitting element 1000 is assembled biased in one direction in the assembly hole 1102. That is, the region in which the electrode 2091 is formed includes the first conductivity type semiconductor layer 1030, the insulating layer 1070, and the magnetic layer 1050. Therefore, the first conductivity type semiconductor layer 1030 and the second conductivity type semiconductor layer beneath the magnetic layer 1050 are electrically connected to each other by the same electrode. Finally, when the voltage is applied to the first conductivity type electrode 2091 to drive the semiconductor light-emitting element 1000, because an electric current flows through the semiconductor layers and a voltage difference does not occur, the semiconductor light-emitting element 1000 becomes not able to function as the light emitting diode.

Figure 21:
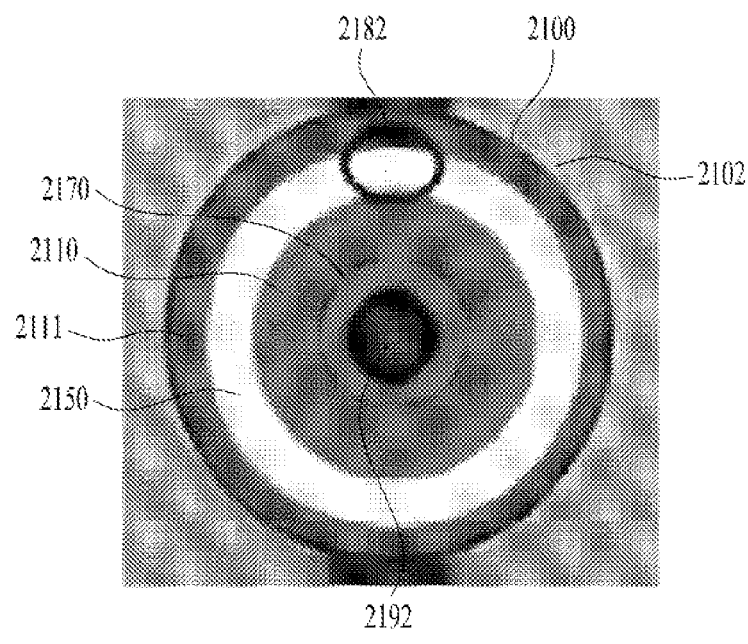
FIG. 21 is an optical image showing a difference in electrode hole definition position between semiconductor light-emitting elements actually assembled based on a shape of assembly electrodes.
Figure 21:
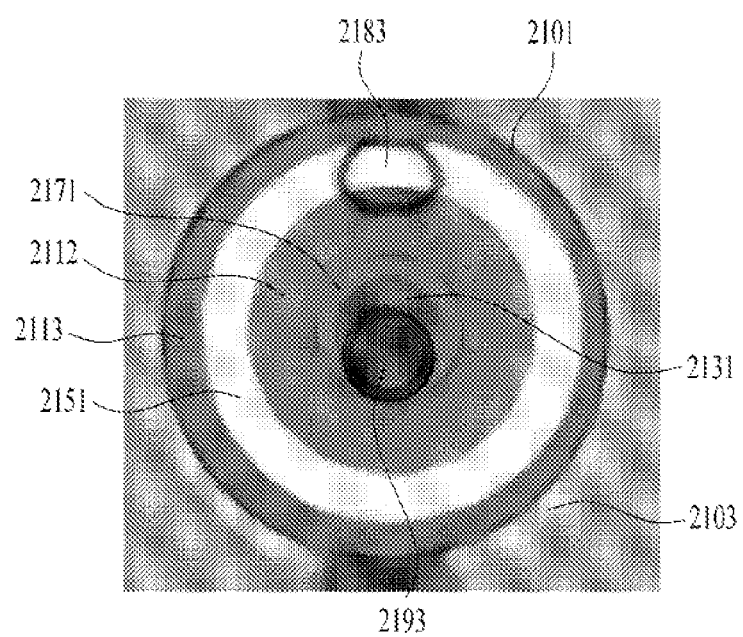

FIG. 21 is an optical image showing a difference in electrode hole definition position between semiconductor light-emitting elements actually assembled based on a shape of assembly electrodes.

(a) in FIG. 21 is an optical image of a semiconductor light-emitting element 2100 having assembly electrodes that form the non-uniform electric field in the horizontal direction with the substrate according to the present disclosure.

As shown in (a) in FIG. 21, the semiconductor light-emitting element 2100 includes a first conductivity type semiconductor layer, a second conductivity type semiconductor layer 2110 and 2111, an insulating layer 2170, and a magnetic layer 2150. By the magnetic layer 2150 disposed in a band shape on top of the second conductivity type semiconductor layer, when observing the semiconductor light-emitting element 2100 from the top as shown in the optical image of (a) in FIG. 21, the second conductivity type semiconductor layer 2110 and 2111 is divided into two regions. In addition, the semiconductor light-emitting element 2100 is assembled in a specific direction of an assembly hole 2102, and electrode holes 2182 and 2192 are defined in consideration of the same.

Therefore, it may be observed that a first electrode hole 2192 for electrically connecting the first conductivity type semiconductor layer is precisely located on the top of the first conductivity type semiconductor layer, and the first electrode hole 2192 is surrounded by the insulating layer 2170. In addition, a second electrode hole 2182 for electrically connecting the second conductivity type semiconductor layer 2110 and 2111 is defined in the magnetic layer 2150 and the second conductivity type semiconductor layer 2110 and 2111. In this connection, the second conductivity type semiconductor layer 2110 and 2111 is electrically connected through the magnetic layer 2150, so that a definition position of the second electrode hole 2182 is not a problem.

(b) in FIG. 21 is an optical image of a semiconductor light-emitting element 2102 having assembly electrodes that form the uniform electric field in the horizontal direction with the substrate according to the prior art.

As shown in (b) in FIG. 21, the semiconductor light-emitting element 2101 includes a first conductivity type semiconductor layer 2131, a second conductivity type semiconductor layer 2112 and 2113, an insulating layer 2171, and a magnetic layer 2151. The semiconductor light-emitting element 2101 is assembled at an arbitrary position in the assembly hole 2102, and electrode holes 2183 and 2193 are defined based on a center position of an assembly hole 2103.

In (b) in FIG. 21, because the semiconductor light-emitting element 2101 is assembled in contact with a top of the assembly hole 2103, the electrode holes 2183 and 2193 are defined without reflecting an assembly gap between the semiconductor light-emitting element 2101 and the assembly hole 2103.

Thus, as shown in (b) in FIG. 21, a first electrode hole 2193 for electrically connecting the first conductivity type semiconductor layer 2131 is located at a boundary between the first conductivity type semiconductor layer 2131, the insulating layer 2171, and the second conductivity type semiconductor layer 2112. In addition, a second electrode hole 2183 for electrically connecting the second conductivity type semiconductor layer is defined on top of the magnetic layer 2151.

After all, when the semiconductor light-emitting element 2101 is subjected to the subsequent wiring process, an electrode formed through the first electrode hole 2193 is formed at the boundary between the first conductivity type semiconductor layer 2131, the insulating layer 2171, and the second conductivity type semiconductor layer 2112. Therefore, when the voltage is applied to an individual semiconductor layer to drive the semiconductor light-emitting element 2101, because the first conductivity type semiconductor layer 2131 and the second conductivity type semiconductor layer 2112 and 2113 are electrically connected to each other, the semiconductor light-emitting element 2101 becomes not able to function as the light emitting diode.

That is, according to the present disclosure, it is possible to preset the assembly gap between the assembly hole and the semiconductor light-emitting element, which may be problematic in the self-assembly scheme. Accordingly, by performing the electrode hole definition and the wiring process thereafter based on the set assembly gap, it is possible to minimize the short and the open defects that may occur in the wiring process.

The above description is merely illustrative of the technical idea of the present disclosure, and various modifications and variations are possible within the scope that does not depart from the essential characteristics of the present disclosure by those with ordinary knowledge in the technical field to which the present disclosure belongs.

Accordingly, the embodiments disclosed in the present disclosure are for description rather than limiting the technical idea of the present disclosure, and the scope of the technical idea of the present disclosure is not limited by such embodiments.

The scope of the present disclosure should be interpreted by the claims below, and all technical ideas within the scope equivalent thereto should be interpreted as being included in the scope of the present disclosure.

What is claimed is:

1. A display device comprising:
   a substrate;
   a first assembly electrode and a second assembly electrode disposed on the substrate to be spaced apart from each other;
   an insulating layer on the first assembly electrode and the second assembly electrode;
   an assembly hole formed on the insulating layer;
   a semiconductor light-emitting element disposed in the assembly hole and corresponding to a pixel region; and
   a wiring electrode electrically connected to the semiconductor light-emitting element,
   wherein the first assembly electrode and the second assembly electrode are configured in a pattern to generate a non-uniform electric field in the assembly hole based on an applied voltage,
   wherein a specific position of the semiconductor light-emitting element in the assembly hole is achieved based on the non-uniform electric field for assembly.

2. The display device of claim 1, wherein the specific position in the assembly hole is based on a region where a strength of electric field is relatively stronger of the non-uniform electric field generated in the assembly hole.

3. The display device of claim 2, wherein the first assembly electrode and the second assembly electrode are disposed to overlap the assembly hole, and
   wherein a separation distance between the first assembly electrode and the second assembly electrode is less than a horizontal width of the semiconductor light-emitting element.

4. The display device of claim 3, wherein there are at least two different separation distances between the first assembly electrode and the second assembly electrode, and
   wherein the specific position of the semiconductor light-emitting element is toward a position corresponding to a minimum separation distance among the at least two different separation distances.

5. The display device of claim 2, wherein at least one of the first assembly electrode or the second assembly electrode is formed at a position overlapping the assembly hole.

6. The display device of claim 1, wherein the first assembly electrode and the second assembly electrode are symmetrical with respect to each other, and each have protrusions respectively protruding toward a center of the assembly hole,
   wherein the specific position of the semiconductor light-emitting element is aligned with the center of the assembly hole.

7. The display device of claim 2, wherein a width of the assembly hole is greater than a horizontal width of the semiconductor light-emitting element, and
   wherein a depth of the assembly hole is greater than a height of the semiconductor light-emitting element.

8. The display device of claim 1, wherein the semiconductor light-emitting element includes a first conductivity type semiconductor layer, an active layer, a second conductivity type semiconductor layer, and a magnetic layer.

9. The display device of claim 1, wherein the substrate is equipped with a transistor for driving an active matrix.

10. A method for manufacturing a display device, the method comprising:
    forming a pair of assembly electrodes spaced apart from each other on a first substrate;
    depositing an insulating layer on the first substrate having the pair of assembly electrodes formed thereon;
    defining an assembly hole in the insulating layer;
    providing a semiconductor light-emitting element having a shape corresponding to a shape of the assembly hole and having a magnetic layer;
    bringing the semiconductor light-emitting element into contact with the assembly hole of the insulating layer using an assembly apparatus having a magnetic body; and
    applying a voltage to at least one of the pair of assembly electrodes to position the semiconductor light-emitting element at a specific position in the assembly hole,
    wherein the pair of assembly electrodes are configured in a pattern to generate a non-uniform electric field in the assembly hole based on the applied voltage, and
    wherein the specific position in the assembly hole is based on a region where a strength of electric field is relatively stronger of the non-uniform electric field generated in the assembly hole.

11. The method of claim 10, further comprising transferring the semiconductor light-emitting element assembled onto the first substrate to a second substrate.

12. The method of claim 11, wherein the transferring of the semiconductor light-emitting element to the second substrate includes:
forming a wiring electrode and a conductive adhesive layer on the second substrate; and
attaching the first substrate to the conductive adhesive layer such that the semiconductor light-emitting element of the first substrate is aligned with the wiring electrode.

13. The method of claim 10, further comprising forming a wiring electrode electrically connected to the semiconductor light-emitting element assembled onto the first substrate.

14. The method of claim 10, wherein the assembly hole is defined at a position overlapping at least one of the pair of assembly electrodes.

15. The method of claim 10, wherein the applying the voltage to at least one of the pair of assembly electrodes includes applying an alternating voltage to one of the pair of assembly electrodes, and grounding the other.

16. The method of claim 15, wherein the alternating voltage is varied in a range from 5 V to 20 V.

17. The method of claim 10, wherein the semiconductor light-emitting element is a micro-LED having a size on the order of micrometers.

18. A display device comprising:
a substrate;
a first assembly electrode and a second assembly electrode disposed on the substrate to be spaced apart from each other;
an insulating layer deposited on the first assembly electrode and the second assembly electrode;
an assembly hole formed on the insulating layer;
a semiconductor light-emitting element disposed in the assembly hole and corresponding to a pixel region; and
a wiring electrode electrically connected to the semiconductor light-emitting element,
wherein the first assembly electrode and the second assembly electrode are configured in a pattern to generate an electric field in the assembly hole based on an applied voltage, and
wherein the electric field in the assembly hole varies along a length direction of the first assembly electrode and the second assembly electrode.

19. The display device of claim 18, wherein the first assembly electrode and the second assembly electrode are symmetrical with respect to each other.

20. The display device of claim 18, wherein a width of a portion of the first assembly electrode overlapping the assembly hole and a width of a portion of the second assembly electrode overlapping the assembly hole are varied along the length direction.

* * * * *